US008008659B2

(12) United States Patent
Ikenaga et al.

(10) Patent No.: US 8,008,659 B2
(45) Date of Patent: Aug. 30, 2011

(54) SEMICONDUCTOR INTEGRATED CIRCUIT DEVICE

(75) Inventors: Yoshifumi Ikenaga, Tokyo (JP); Koichi Takeda, Tokyo (JP); Masahiro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 510 days.

(21) Appl. No.: 11/261,753

(22) Filed: Oct. 31, 2005

(65) Prior Publication Data

US 2006/0091936 A1 May 4, 2006

(30) Foreign Application Priority Data

Nov. 1, 2004 (JP) .................................. 2004-318470

(51) Int. Cl.
H01L 23/58 (2006.01)
H01L 29/10 (2006.01)
H03K 3/01 (2006.01)

(52) U.S. Cl. ........................................ 257/48; 327/534
(58) Field of Classification Search .................... 257/48; 327/534

See application file for complete search history.

(56) References Cited

U.S. PATENT DOCUMENTS

| 5,834,967 | A | * | 11/1998 | Kuroda et al. | 327/543 |
| 6,097,113 | A | * | 8/2000 | Teraoka et al. | 307/125 |
| 6,100,751 | A | * | 8/2000 | De et al. | 327/534 |
| 7,138,851 | B2 | * | 11/2006 | Sumita et al. | 327/534 |

FOREIGN PATENT DOCUMENTS

| JP | 03-228360 A | 10/1991 |
| JP | 6-139779 A | 5/1994 |
| JP | 07-254685 A | 10/1995 |
| JP | 8-17033 B2 | 2/1996 |
| JP | 09-186565 A | 7/1997 |
| JP | 09-214322 A | 8/1997 |
| JP | 10-289580 A | 10/1998 |
| JP | 2902804 B2 | 3/1999 |
| JP | 2000-357962 A | 12/2000 |
| JP | 3184265 B2 | 4/2001 |

(Continued)

OTHER PUBLICATIONS

C. Neau, et al.; "Optimal Body Bias Selection for Leakage Improvement and Process Compensation Over Different Technology Generations"; Low Power Electronics and Design, 2003; ISLPED '03; Proceedings of the 2003 International Symposium on Aug. 25-27, 2003; Seoul, Korea; pp. 116-121.

*Primary Examiner* — W. David Coleman
(74) *Attorney, Agent, or Firm* — Sughrue Mion, PLLC

(57) ABSTRACT

A substrate bias is controlled such that a leakage current is minimum. A semiconductor integrated circuit device comprises a leakage detecting circuit which detects a leakage current by using leakage detecting MOSFETs, a control circuit which generates a control signal depending on an output from the leakage detecting circuit, a substrate bias generating circuit which changes a substrate bias depending on the control signal, and a controlled circuit including a MOSFET having the same characteristics as that of each of the leakage detecting MOSFETs. The leakage detecting circuit detects a substrate leakage current which includes as the substrate bias becomes deep and a subthreshold leakage current which decreases as the substrate bias becomes deep. A control signal is transmitted to the substrate bias generating circuit such that the substrate bias is made deep when the substrate leakage current is smaller than the subthreshold leakage current and such that the substrate bias is made shallow when the substrate leakage current is larger than the subthreshold leakage current.

26 Claims, 31 Drawing Sheets

FOREIGN PATENT DOCUMENTS

| | | |
|---|---|---|
| JP | 2002-076873 A | 3/2002 |
| JP | 2004-165649 A | 6/2004 |
| JP | 2005-197411 A | 7/2005 |
| JP | 2005-339590 A | 12/2005 |
| WO | WO 03/094235 A1 | 11/2003 |
| WO | WO 2004/030191 A1 | 4/2004 |

* cited by examiner

FIG. 1 - Related Art
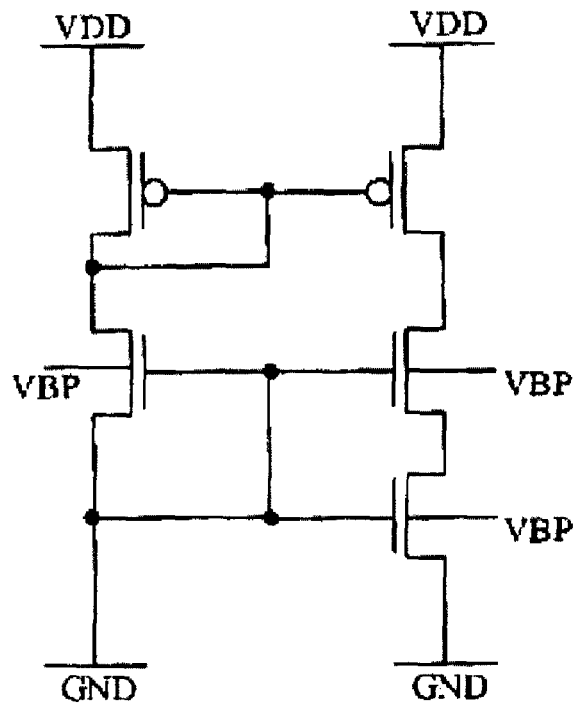
FIG. 2 - Related Art
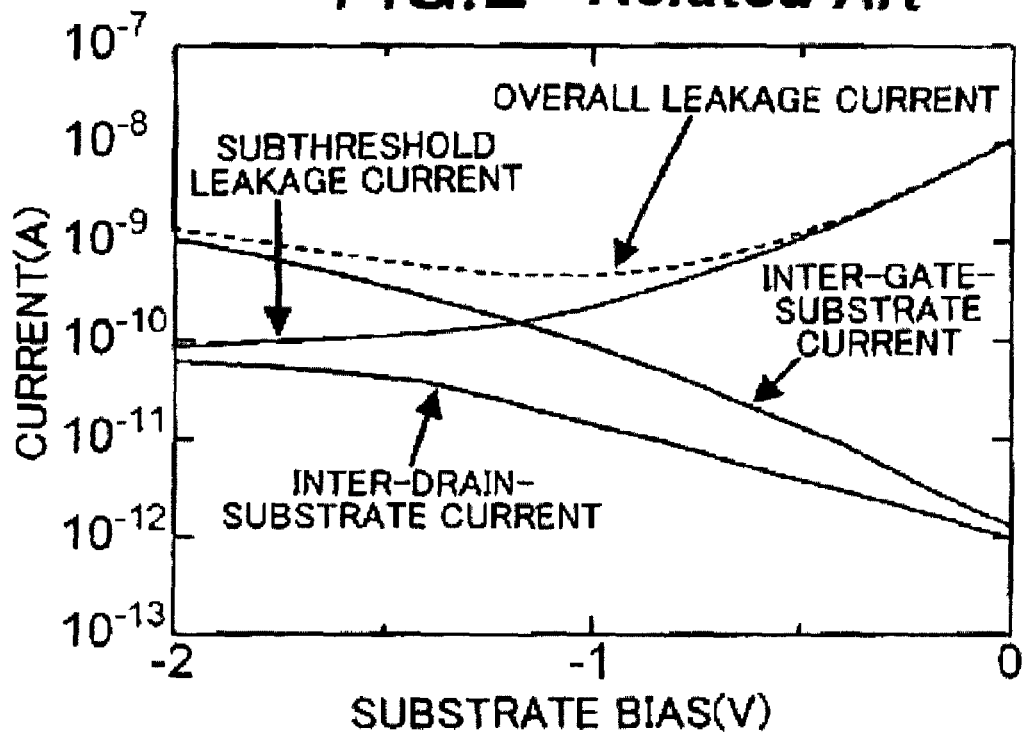

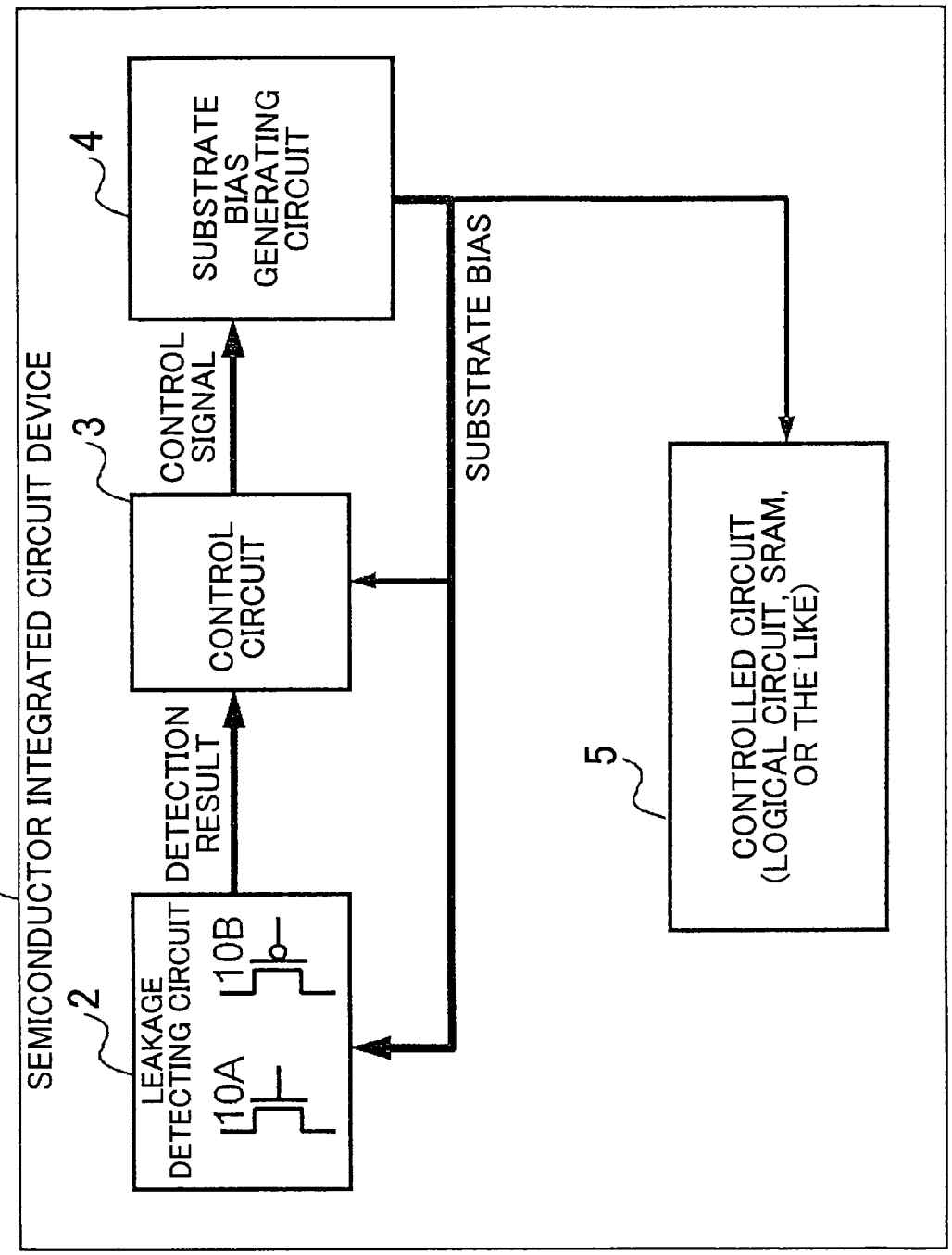

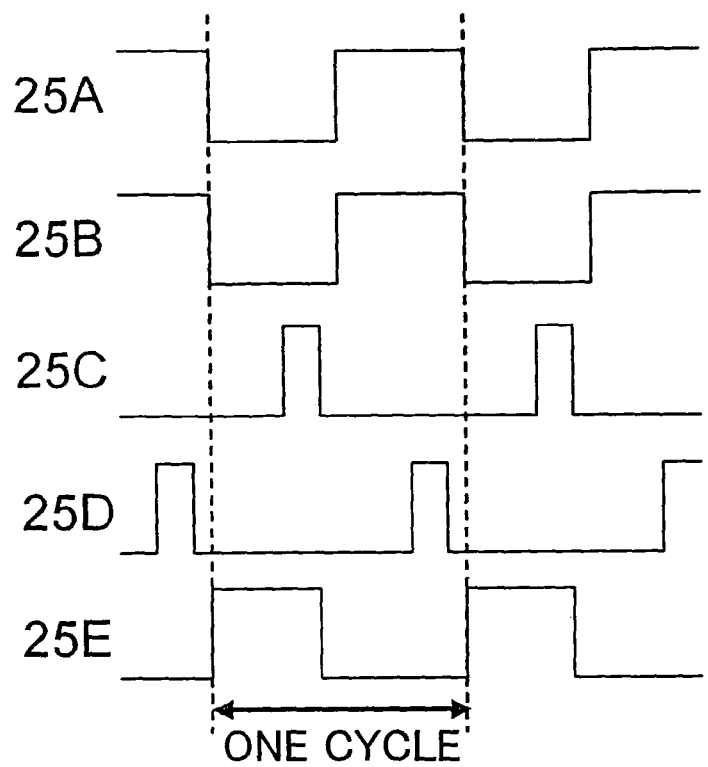
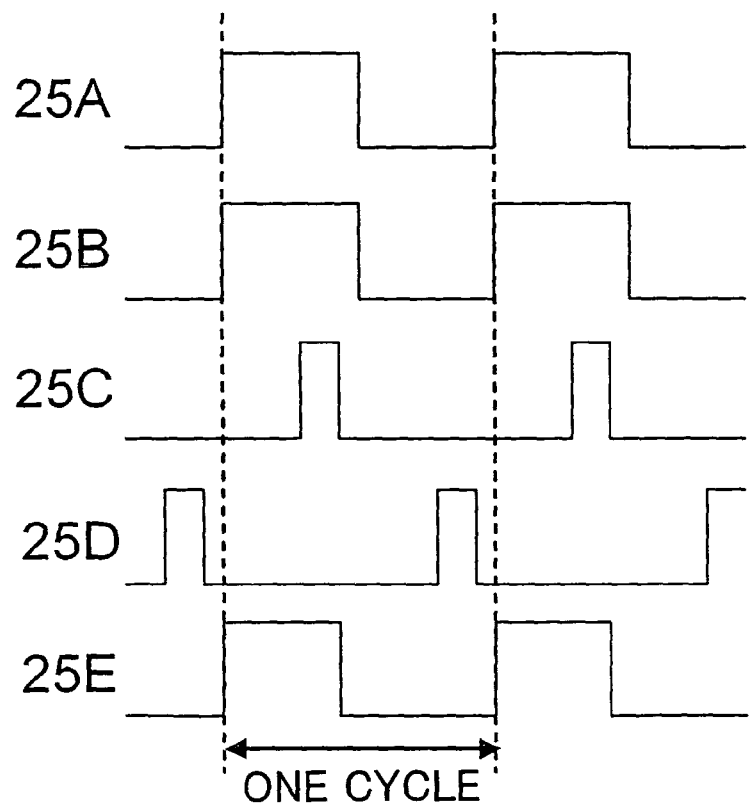

SEMICONDUCTOR INTEGRATED CIRCUIT DEVICE

BACKGROUND OF THE INVENTION

1. Field of the Invention

The present invention relates to a semiconductor integrated circuit device and, more specifically, to a semiconductor integrated circuit device in which a substrate bias is controlled.

2. Description of the Related Art

A semiconductor integrated circuit device using a MOSFET, in order to reduce a power consumption in a standby state, a technique which applies a deep substrate bias to an element to increase a threshold voltage and to reduce a leakage current is popularly used. However, depending on characteristics of elements, when a substrate bias has a depth which is equal to or larger than a predetermined value, a phenomenon to increase a leakage current on the contrary is caused by an effect such as GIDL (Gate Induced Drain Leakage). Therefore, in order to reduce a leakage current as much as possible, the substrate bias must be controlled to a predetermined value. The GIDL is the following phenomenon, that is, when a negative bias and a positive bias are applied to a gate electrode and a drain electrode, respectively, a depletion layer extends into a drain region, and an electric field density increases in the region in which the depletion layer extends. For this reason, electrons cause BTBT (Band To Band Tunneling) to cause a leakage current to flow.

In order to calculate an optimum substrate bias value at which a leakage current is minimized, for example, in LOW POWER ELECTRONICS AND DESIGN, 2003. ISLPED '03. PROCEEDINGS OF THE 2003 INTERNATIONAL SYMPOSIUM ON, 25-27 Aug. 2003, p. 116-121, by using a circuit shown in FIG. 1, a substrate leakage current serving as a main component of the leakage current is compared with a subthreshold leakage current. In this conventional technique, by using characteristics in which the substrate leakage current increases and the subthreshold leakage current decreases as the substrate bias is made deep, a value at which the substrate leakage current is equal to the subthreshold leakage current is set as a substrate bias value.

For example, in JP-2004-165649A, a substrate bias dependence of a leakage current is previously measured to directly calculate a substrate bias value at which the leakage current is minimized.

However, in the circuit shown in FIG. 1, it is assumed that a subthreshold leakage current obtained by vertically stacked elements can be neglected. This assumption is based on the premise that a DIBL (Drain Induced Barrier Lowering) effect and a substrate effect are great. For this reason, when the DIBL effect and the substrate effect are small, a detection error of the leakage current increases. Furthermore, since a gate leakage current is neglected as a small current, when the gate leakage current is large, the detection error increases. For example, in an element having characteristics shown in FIG. 2, since an inter-gate-substrate current is large, a bias at which a total leakage current is minimum is approximately −1 V. When the circuit shown in FIG. 1 is applied to the element, the substrate bias at which the leakage current is minimum is determined as −2 V in comparison between the subthreshold leakage current and the inter-drain-substrate current, and an actual leakage current is several times the leakage current obtained when the substrate bias is −1 V. In addition, in the conventional technique in FIG. 1, a plurality of leakage currents are detected in different elements, respectively. For this reason, the detection error increases because of fluctuations in characteristic and temperature of the elements.

Furthermore, the substrate bias dependence of a leakage current must be measured in advance by the method described in JP-2004-165649A. For this reason, when the characteristics of an element vary due to a change in temperature or the like, the measurement of the substrate bias dependence must be performed each time the characteristics of the element vary. If a value at which the leakage current is minimum is automatically measured in a chip, a mechanism which holds a current value and a potential value is required.

SUMMARY OF THE INVENTION

The present invention has been made to solve the above problem and has as its object to provide a semiconductor integrated circuit in which characteristics of an element need not be measured and in which a substrate bias is controlled such that a total leakage current of the element including a gate leakage current is minimum.

A semiconductor integrated circuit device according to one aspect of the present invention comprises a leakage detecting circuit which includes a MOSFET for detecting leakage, detects a component of a leakage current of the MOSFET, and outputs a control signal corresponding to the component of the leakage current; and a substrate bias generating circuit which changes a substrate bias of a semiconductor substrate depending on a control signal.

A semiconductor integrated circuit device according to another aspect of the present invention comprises a leakage detecting circuit which detects a leakage current of a semiconductor substrate and a substrate bias generating circuit which changes a substrate bias. The leakage detecting circuit detects a substrate leakage current which increases as the substrate bias becomes deep and detects a subthreshold leakage current which decreases as the substrate bias becomes deep, and transmits a control signal to the substrate bias generating circuit such that the substrate bias is made deep when the substrate leakage current is smaller than a predetermined magnification of a subthreshold leakage current and the substrate bias is made shallow when the substrate leakage current is larger than the predetermined magnification.

According to the present invention, predetermined components of a leakage current of a semiconductor element in a semiconductor substrate are compared with each other to control a substrate bias such that the leakage current is minimum. For this reason, a leakage current on which element characteristics in the semiconductor-substrate is reflected can be minimized.

BRIEF DESCRIPTION OF THE DRAWINGS

FIG. 1 is a circuit diagram showing a conventional leakage detecting circuit configuration;

FIG. 2 is a graph showing substrate bias dependences of respective leakage current components of an n-type MOSFET;

FIG. 3 is a block diagram showing an entire configuration of a semiconductor integrated circuit device according to a first example of the present invention;

FIG. 35 is a timing chart showing timings of control clocks in the fourteenth example of the present invention;

FIG. 36 is a timing chart showing timings of control clocks in the fourteenth example of the present invention;

DESCRIPTION OF THE PREFERRED EMBODIMENTS

Figure 4:
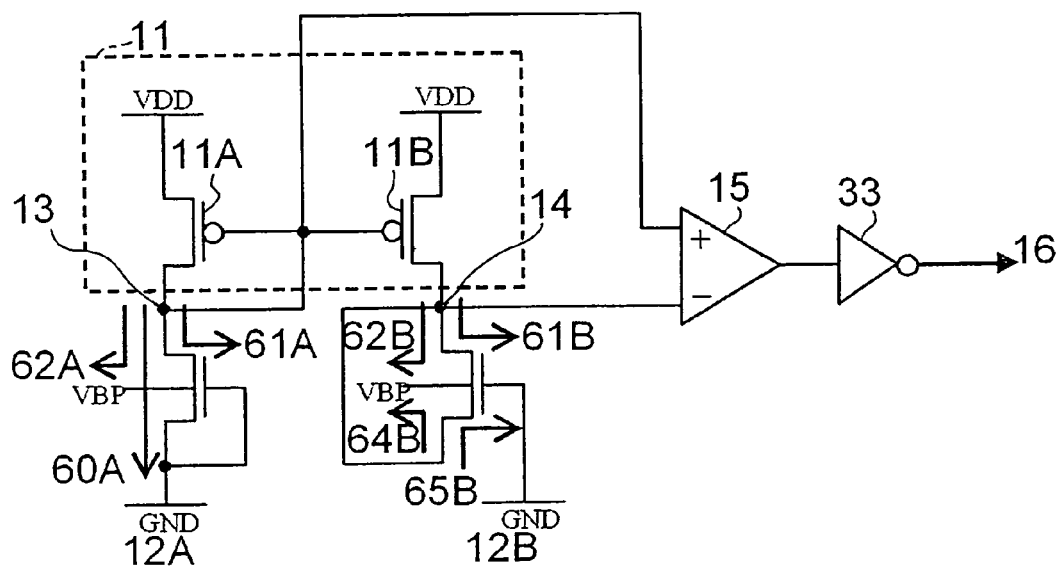
FIG. 4 is a circuit diagram showing a leakage detecting circuit in the first example of the present invention.

According to a first embodiment of the present invention, there is provided a semiconductor integrated circuit device including a leakage detecting circuit which detects a leakage current of a semiconductor substrate and a substrate bias generating circuit which changes a substrate bias, wherein the leakage detecting circuit detects a substrate leakage current which increases as the substrate bias becomes deep and a subthreshold leakage current which decreases as the substrate bias becomes deep, and the control circuit transmits a control signal to the substrate bias generating circuit such that the substrate bias is made deep when the substrate leakage current is smaller than the subthreshold leakage current and the substrate bias is made shallow when the substrate leakage current is larger than the subthreshold leakage current. With the circuit configuration, the substrate bias can be controlled without measuring a substrate bias dependence such that the leakage current is minimum. Furthermore, an optimum substrate bias can be determined while following a change in element characteristic by a change in temperature.

According to a second embodiment of the present invention, there is provided a semiconductor integrated circuit device wherein, in the semiconductor integrated circuit device according to the first embodiment, the leakage detecting circuit detects both an inter-drain-substrate current and an inter-gate-substrate circuit. With the circuit configuration, when the inter-gate-substrate current is not negligibly smaller than the inter-drain-substrate current and the subthreshold leakage current, the substrate bias can be controlled to an optimum value at a high precision.

According to a third embodiment of the present invention, there is provided a semiconductor integrated circuit device which has a plurality of leakage detecting elements in the semiconductor integrated circuit device according to the first embodiment, wherein the leakage detecting elements detect different component of a leakage current to make it possible to compare a substrate leakage current with a subthreshold leakage current on the basis of detection results. With the circuit configuration, a degree of freedom of the circuit configuration increases, a component such as a gate current which influences leakage detecting precision can be easily canceled.

According to a fourth embodiment of the present invention, there is provided a semiconductor integrated circuit device wherein, in the semiconductor integrated circuit device according to the third embodiment, a source of a leakage detecting element which does not detect a subthreshold leakage current is connected to a drain, or a source is completely disconnected from another node. With the circuit configuration, since the subthreshold leakage current does not flows in the leakage detecting element which does not detect the subthreshold leakage current at all, the substrate bias can be controlled to an optimum value at high precision.

According to a fifth embodiment of the present invention, there is provided a semiconductor integrated circuit device wherein, in the semiconductor integrated circuit device according to the first embodiment, a plurality of different leakage current components are detected from a single leakage detecting element, and a substrate leakage current can be compared with a subthreshold leakage current on the basis of detection result. With the circuit configuration, since a fluctuation in characteristic of the elements which cannot be inevitable when the plurality of leakage detecting elements are used can be eliminated, a substrate bias can be controlled to an optimum value at a high precision.

According to a sixth embodiment of the present invention, there is provided a semiconductor integrated circuit device wherein, in the semiconductor integrated circuit device according to the first embodiment, the leakage detecting element has a source fixed to a ground potential when the leakage detecting element is an n-type MOSFET, and the leakage detecting element has a source fixed to a power supply voltage when the leakage detecting element is a p-type MOSFET. With the circuit configuration, a leakage current of an OFF element can be reproduced at a high precision.

According to a seventh embodiment of the present invention, there is provided a semiconductor integrated circuit device wherein, in the semiconductor integrated circuit device according to the first embodiment, the leakage detecting element has a drain fixed to a power supply voltage when the leakage detecting element is an n-type MOSFET, and the leakage detecting element has a drain fixed to a ground potential when the leakage detecting element is a p-type MOSFET. With the circuit configuration, a leakage current of an OFF element can be reproduced at a high precision.

According to an eighth embodiment of the present invention, there is provided a semiconductor integrated circuit device wherein, in the semiconductor integrated circuit device according to the first embodiment, an inter-source-drain voltage of the leakage detecting element is fixed to a power supply voltage. With the circuit configuration, a leakage current of an OFF element can be reproduced at a high precision.

According to a ninth embodiment of the present invention, there is provided a semiconductor integrated circuit device wherein, in the semiconductor integrated circuit device according to the first embodiment, connections in the circuit are dynamically switched to detect a plurality of current components from a single element. With the circuit configuration, since a fluctuation in characteristic of the elements which cannot be inevitable when the plurality of leakage detecting elements are used can be eliminated, a substrate bias can be controlled to an optimum value at a high precision. Furthermore, a degree of freedom of the circuit configuration increases, a component such as a gate current which influences leakage detecting precision can be easily canceled.

According to a tenth embodiment of the present invention, there is provided a semiconductor integrated circuit device wherein, in the semiconductor integrated circuit device according to the first embodiment, the device has a detection mode and an energization mode and both the modes can be switched by dynamically changing connections in the circuit, a circuit configuration of the device is same as that according to the first to ninth embodiments in the detection mode, and an ON current can be flown in the element in the energization mode. With the circuit configuration, aged deterioration of the element can be reproduced, and a substrate bias can be controlled to an optimum value at a high precision.

According to an eleventh embodiment of the present invention, there is provided a semiconductor integrated circuit device having a plurality of leakage detecting circuits in the semiconductor integrated circuit device according to the first embodiment. With the circuit configuration, even though some leakage detecting circuit exhibits abnormal operations, the influences of the abnormal operations can be minimized.

First Example

FIG. 3 shows a first example of a semiconductor integrated circuit device according to the present invention. A semiconductor integrated circuit device 1 includes a leakage detecting circuit 2 having a leakage detecting MOSFET, a control circuit 3 which generates a control signal depending on an output from the leakage detecting circuit 2, a substrate bias generating circuit 4 which changes a substrate bias of a semiconductor circuit depending on a control signal, and a controlled circuit 5. The controlled circuit 5 is a circuit of which the leakage current of which is to be reduced according to the present invention, and is constituted by, for example, a logical circuit or a circuit such as an SRAM. The controlled circuit 5 is present on a semiconductor substrate on which the leakage detecting circuit 2 is present. The MOSFET in the controlled circuit 5 has the same characteristics of the leakage detecting MOSFET.

An overall operation will be described first. The leakage detecting circuit 2 has at least one of a p-type MOSFET 10A and an n-type MOSFET 10B for detecting a leakage current and transmits a result obtained by detecting the leakage current to the control circuit 3. The control circuit 3 transmits a control signal generated depending on an output from the leakage detecting circuit 2 to the substrate bias generating circuit 4. The substrate bias generating circuit 4 injects electronic charges into the substrate or pulls electronic charges from the substrate depending on the control signal received from the control circuit 3 to change substrate biases in the leakage detecting circuit 2, the control circuit 3, and the controlled circuit 5, at least the substrate biases in the leakage detecting circuit 2 and the controlled circuit 5.

An operation of the leakage detecting circuit 2 will be described next. All the following explanations are based on the assumption that a leakage detecting element is an n-type MOSFET. However, even though the leakage detecting element is a p-type MOSFET, the explanations are established.

FIG. 4 shows a configuration of a leakage detecting circuit in the example. The leakage detecting circuit includes a MOSFET 11A and a MOSFET 11B which constitute a current mirror circuit 11, a leakage detecting MOSFET 12A, a leakage detecting MOSFET 12B, an operational amplifier 15, and an inverter 33. The MOSFET 11A and the MOSFET 11B which constitute the current mirror circuit 11 are p-type MOSEFTs having equal element sizes.

As the MOSFET 12A and the MOSFET 12B which detect leakage currents, elements having the same characteristics as those in an element used in the controlled circuit 5 is used. Furthermore, the MOSFET 12A and the MOSFET 12B have equal element sizes, respectively. The MOSFET 12B has a drain area and a source area which are equal to each other.

The gate and the source of the MOSFET 12A are commonly grounded (GND). The drain of the MOSFET 12A is commonly connected to the drain and the gate of the MOSFET 11A and the gate of the MOSFET 11B and connected to a non-inverted input terminal of the operational amplifier 15. The gate of the MOSFET 12B is grounded (GND). The drain and the source of the MOSFET 12B are commonly connected to the drain of the MOSFET 11B and connected to an inverted input terminal of the operational amplifier 15. The sources of the MOSFET 11A and the MOSFET 11B are connected to a power supply (VDD). An output terminal of the operational amplifier 15 is connected to the input terminal of the inverter 33, and an output terminal of the inverter 33 corresponds to an output 16 from a detecting circuit.

In the above circuit configuration, a drain current in the MOSFET 11A is equal to a sum of a inter-drain-substrate current 62A of the MOSFET 12A, an inter-drain-gate current 61A, and a subthreshold leakage current 60A. On the other hand, a drain current in the MOSFET 11B is equal to a sum of a inter-drain-substrate current 62B of the MOSFET 12B, an inter-source-substrate current 64B, an inter-drain-gate current 61B, and an inter-source-gate current 65B. However, since the drain area and the source area of the MOSFET 12B are equal to each other, the inter-drain-substrate current 62B and the inter-source-substrate current 64B are equal to each other.

In this case, when the inter-drain-gate current 61A, the inter-drain-gate current 61B, and the inter-source-gate current 65B are sufficiently smaller than the subthreshold current and the substrate leakage current and can be neglected, if the subthreshold leakage current 60A is larger than the inter-drain-substrate current 62A, i.e., the subthreshold leakage current is larger than the substrate leakage current, a potential of a node 13 is lower than a potential of a node 14. At this time, the potential of the node 14 is input to the inverted input terminal of the operational amplifier 15, and the potential of the node 13 is input in the non-inverted input terminal of the operational amplifier 15. For this reason, the output 16 from the detecting circuit goes to a high level.

In contrast to this, when the inter-drain-substrate current 62A is larger than the subthreshold leakage current 60A, the potential of the node 13 is higher than the potential of the node 14, the output 16 from the detecting circuit goes to a low level.

When the output 16 from the detecting circuit is at the high level, a control signal is transmitted to the substrate bias generating circuit 4 such that the substrate bias generating circuit 4 operates in a direction to make a substrate bias VBP deep. When the output 16 is at the low level, a control signal is transmitted to the substrate bias generating circuit 4 such that the substrate bias generating circuit 4 operates in a direction to make the substrate bias VBP shallow. In this case, the substrate bias VBP is fixed to such a potential that the subthreshold leakage current and the substrate leakage current are equal to each other. At this time the leakage current is minimum.

In this manner, by using the semiconductor integrated circuit device according to the example, the substrate bias can be controlled such that a leakage current is minimum.

The example is based on the assumption that the leakage current is minimum at a substrate bias at which the substrate leakage current and the subthreshold leakage current are equal to each other. However, when such element characteristics that the leakage current is minimum when the subthreshold leakage current is n times the substrate leakage current are used, the gate width of the MOSFET 12B is made 0.5×(1+n) times the gate width of the MOSFET 12A to make it possible to control the substrate bias such that the leakage current is minimum.

Figure 5:
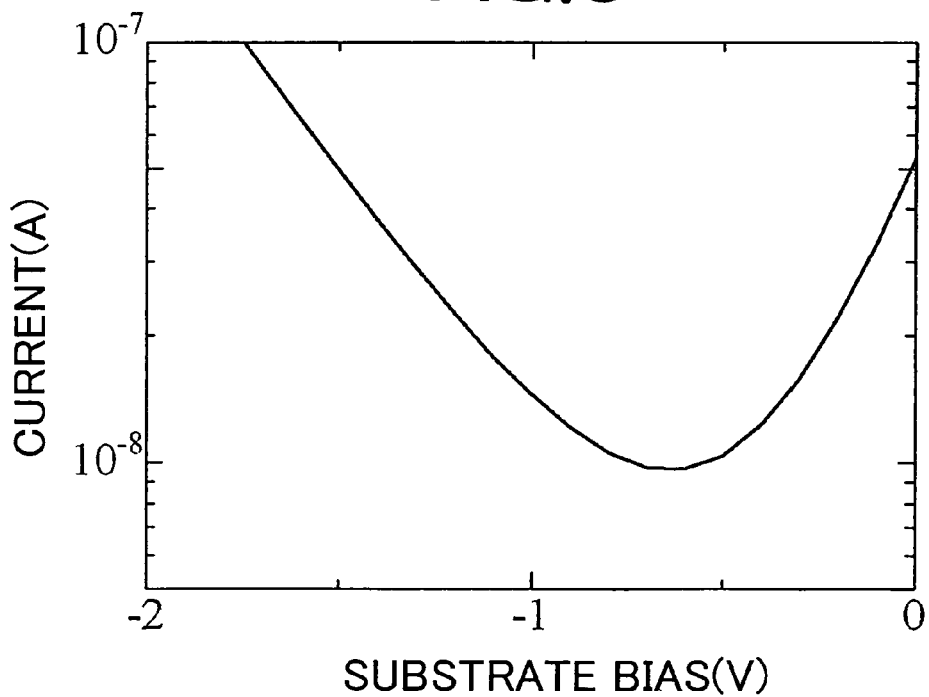
FIG. 5 is a graph showing a substrate bias dependence of a leakage current in an n-type MOSFET in OFF state.

When the characteristics of the MOSFET 12A and the MOSFET 12B fluctuate, the substrate bias may not be fixed to the bias at which the leakage current is minimum. However, as shown in FIG. 5, a substrate bias dependence of the leakage current is very small near the substrate bias at which the leakage current is minimum. For this reason, even though the substrate bias shifts from an optimum point by about 0.2 V, the advantages of the present invention can be sufficiently achieved.

Furthermore, the drain area and the source area of the MOSFET 12B are made equal to each other in the example. However, the drain area and the source area of the MOSFET 12B are not necessarily equal to each other, and a sum of the drain area and the source area of the MOSFET 12B may be merely twice the drain area of the MOSFET 12A. Alternatively, a sum of the inter-drain-substrate current 62B and the inter-source-substrate current 64B when the drain potential of the MOSFET 12A and the drain potential of the MOSFET 12B are equal to each other may be merely twice the inter-drain-substrate current 62A.

In the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Figure 6:
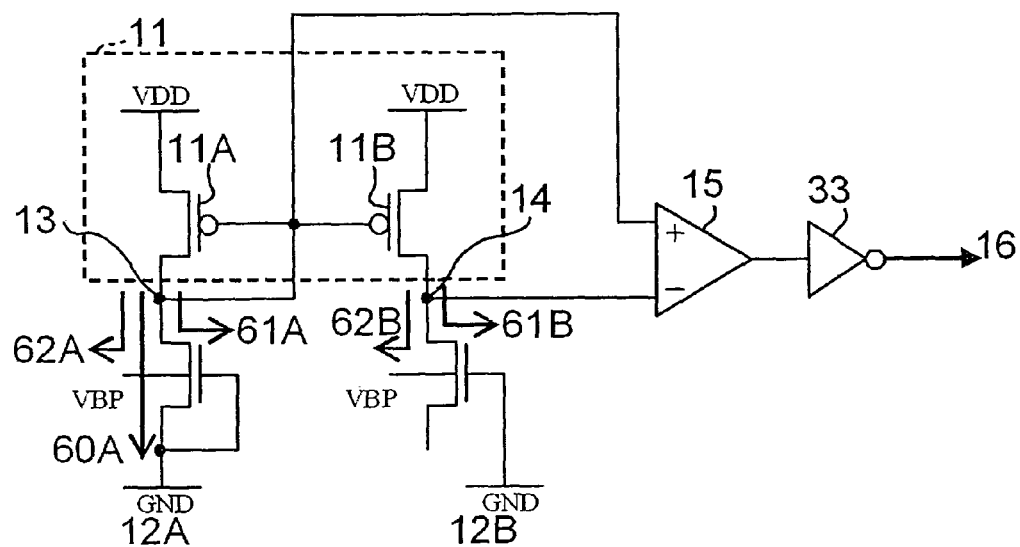
FIG. 6 is a circuit diagram showing a leakage detecting circuit in the first example of the present invention.

Furthermore, in the example, the MOSFET 12A and the MOSFET 12B have equal element sizes, and the source and the drain of the MOSFET 12B are connected to each other. However, when the gate width of the MOSFET 12B is made twice the gate width of the MOSFET 12A, and when the source of the MOSFET 12B is floated as shown in FIG. 6, the advantages of the present invention can be sufficiently achieved.

Second Example

An entire circuit configuration of a second example of the semiconductor integrated circuit device according to the present invention is the same as that of the first example shown in FIG. 3 except for only the circuit configuration the leakage detecting circuit 2. Therefore, only an explanation about the leakage detecting circuit 2 will be performed below. The following explanation is performed with respect to a case in which all leakage detecting elements are n-type MOSFETs. However, the explanation is also established when the leakage detecting elements are p-type MOSFETs.

Figure 7:
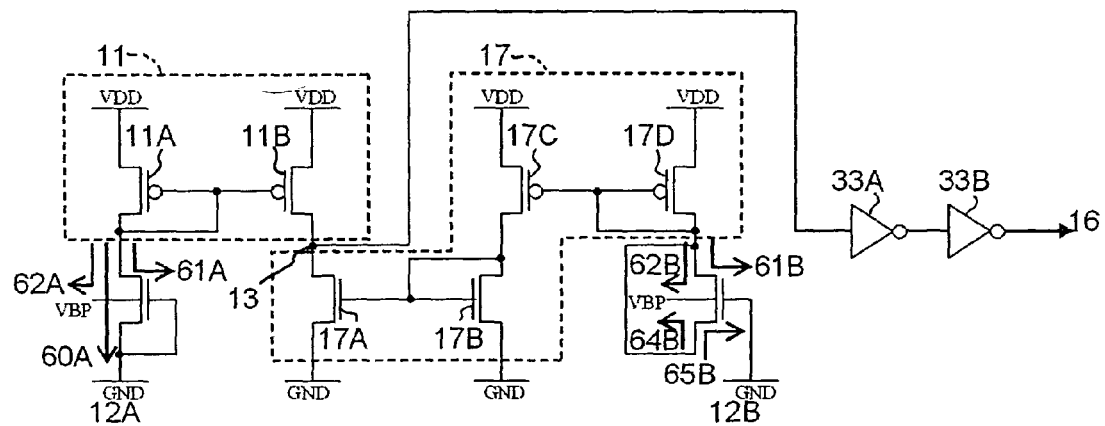
FIG. 7 is a circuit diagram showing a leakage detecting circuit in a second example of the present invention.

FIG. 7 shows the configuration of a leakage detecting circuit according to the example. The leakage detecting circuit is constituted by current mirror circuits 11 and 17, the leakage detecting MOSFETs 12A and 12B, and inverters 33A and 33B.

The MOSFETs 11A and 11B constituting the current mirror circuit 11 are p-type MOSFETs having equal element sizes. The MOSFETs 17A and 17B constituting the current mirror circuit 17 are n-type MOSFETs having equal element sizes, and MOSFETs 17C and 17D are p-type MOSFETs having equal element sizes.

As the MOSFETs 12A and 12B for detecting leakage currents, elements having the same characteristics as those of elements used in the controlled circuit 5 are used, and the element sizes of the MOSFET 12A and the MOSFET 12B are made equal to each other. The drain area and the source area of the MOSFET 12B are made equal to each other.

The drain current of the MOSFET 11A is equal to a sum of the inter-drain-substrate current 62A of the MOSFET 12A, the inter-drain-gate current 61A, and the subthreshold leakage current 60A. On the other hand, the drain current of the MOSFET 17D is equal to a sum of the inter-drain-substrate current 62B, the inter-source-substrate current 64B, the inter-drain-gate current 61B, and the inter-source-substrate current 65B of the MOSFET 12B. Since the drain area and the source area of the MOSFET 12B are equal to each other, the inter-drain-substrate current 62B and the inter-source-substrate current 64B are equal to each other. Furthermore, the drain current of the MOSFET 11A is subjected to mirroring through the current mirror circuit 11 and serves as a current flowing in the node 13. On the other hand, the drain current of the MOSFET 17D is subjected to mirroring through the current mirror circuit 17 and serves as a current flowing in the node 13 like the drain current of the MOSFET 11A.

In this case, when the inter-drain-gate current 61A, the inter-drain-gate current 61B, and the inter-source-gate current 65B are sufficiently smaller than the subthreshold leakage current and the substrate leakage current and can be neglected, if the inter-drain-substrate current 62A is larger than the subthreshold leakage current 60A, that is, the drain current of the MOSFET 17D becomes larger than the drain current of the MOSFET 11A. At this time, the potential of the node 13 approximates to a low level, and the output 16 from the leakage detecting circuit also goes to a low level. In contrast to this, when the drain current of the subthreshold leakage current 60A is larger than the inter-drain-substrate current 62A, the potential of the node 13 approximate to a high level, and the output 16 of the leakage detecting circuit also goes to a high level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

In the circuit configuration, since an operational amplifier is used, a current consumption can be considerably reduced.

The example is based on the assumption that the leakage current is minimum at the substrate bias at which the substrate leakage current and the subthreshold leakage current are equal to each other. However, for example, when such element characteristics that the leakage current is minimum when the subthreshold leakage current is n times the substrate leakage current are used, the gate width of the MOSFET 12B is made 0.5×(1+n) times the gate width of the MOSFET 12A to make it possible to control the substrate bias such that the leakage current is minimum.

When the characteristics of the MOSFET 12A and the MOSFET 12B fluctuate, the substrate bias may not be fixed to the bias at which the leakage current is minimum. However, as shown in FIG. 5, a substrate bias dependence of the leakage current is very small near the substrate bias at which the leakage current is minimum. For this reason, even though the substrate bias shifts from an optimum point by about 0.2 V, the advantages of the present invention can be sufficiently achieved.

Furthermore, the drain area and the source area of the MOSFET 12B are made equal to each other in the example. However, the drain area and the source area of the MOSFET 12B are not necessarily equal to each other, and a sum of the drain area and the source area of the MOSFET 12B may be merely twice the drain area of the MOSFET 12A. Alternatively, a sum of the inter-drain-substrate current 62B and the inter-source-substrate current 64B when the drain potential of the MOSFET 12A and the drain potential of the MOSFET 12B are equal to each other may be merely twice the inter-drain-substrate current 62A.

In the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Figure 8:
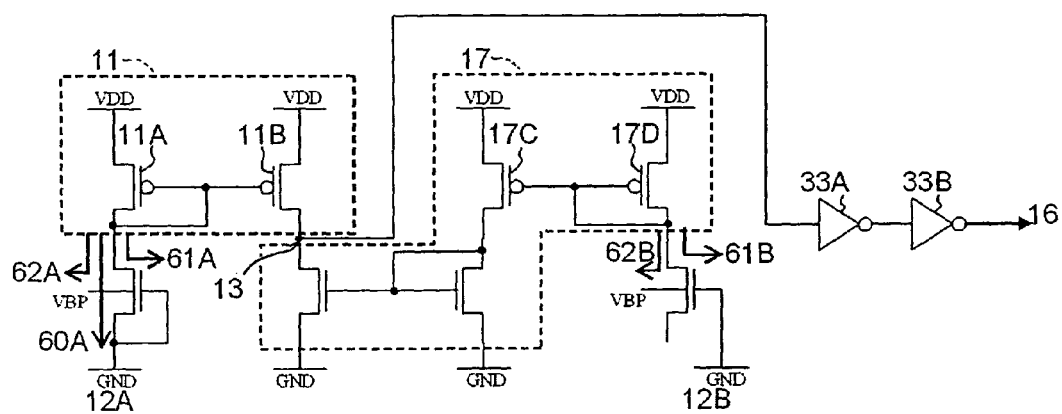
FIG. 8 is a circuit diagram showing the leakage detecting circuit in the second example of the present invention.

Furthermore, in the example, the MOSFET 12A and the MOSFET 12B have equal element sizes, and the source and the drain of the MOSFET 12B are connected to each other. However, the gate width of the MOSFET 12B is made twice the gate width of the MOSFET 12A, and the source of the MOSFET 12B may be floated as shown in FIG. 8. Even in the circuit configuration, the advantages of the present invention can be sufficiently achieved.

Figure 9:
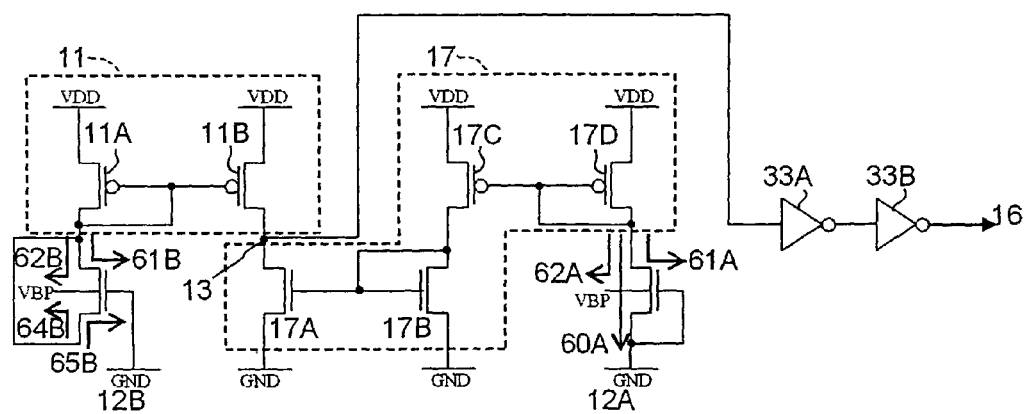
FIG. 9 is a circuit diagram showing the leakage detecting circuit in the second example of the present invention.

The MOSFET 12A and the MOSFET 12B in the circuit configuration in FIG. 7 may be directly replaced with each other to obtain a circuit configuration shown in FIG. 9. In this case, a substrate bias generating circuit operates in a direction to make the substrate bias deep when an output from the detecting circuit is at a low level, and an operation of the substrate bias generating circuit is stopped when the output is at a high level, so that the advantages of the present invention can be obtained.

Figure 10:
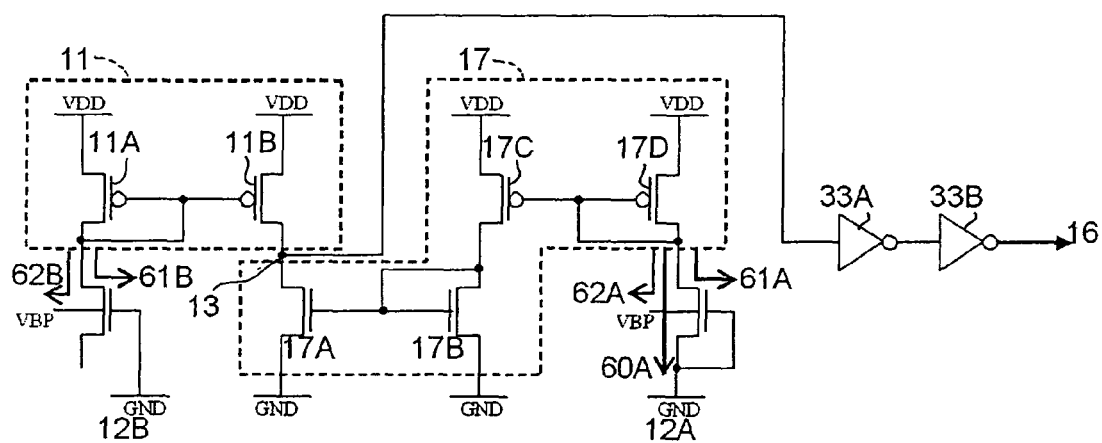
FIG. 10 is a circuit diagram showing the leakage detecting circuit in the second example of the present invention.

The MOSFET 12A and the MOSFET 12B in the circuit configuration in FIG. 8 are directly replaced with each other to obtain a circuit configuration shown in FIG. 10. In this case, a substrate bias generating circuit operates in a direction to make the substrate bias deep when an output from the detecting circuit is at a low level, and an operation of the substrate bias generating circuit is stopped when the output is at a high level, so that the advantages of the present invention can be obtained.

Third Example

An entire circuit configuration in a third example of the semiconductor integrated circuit device according to the present invention is the same as that in the first example shown in FIG. 3 except for only the circuit configuration of the leakage detecting circuit 2. Therefore, only an explanation about the leakage detecting circuit 2 will be performed below. The following explanation is performed with respect to a case in which all leakage detecting elements are n-type MOSFETs. However, the explanation is also established when the leakage detecting elements are p-type MOSFETs.

Figure 11:
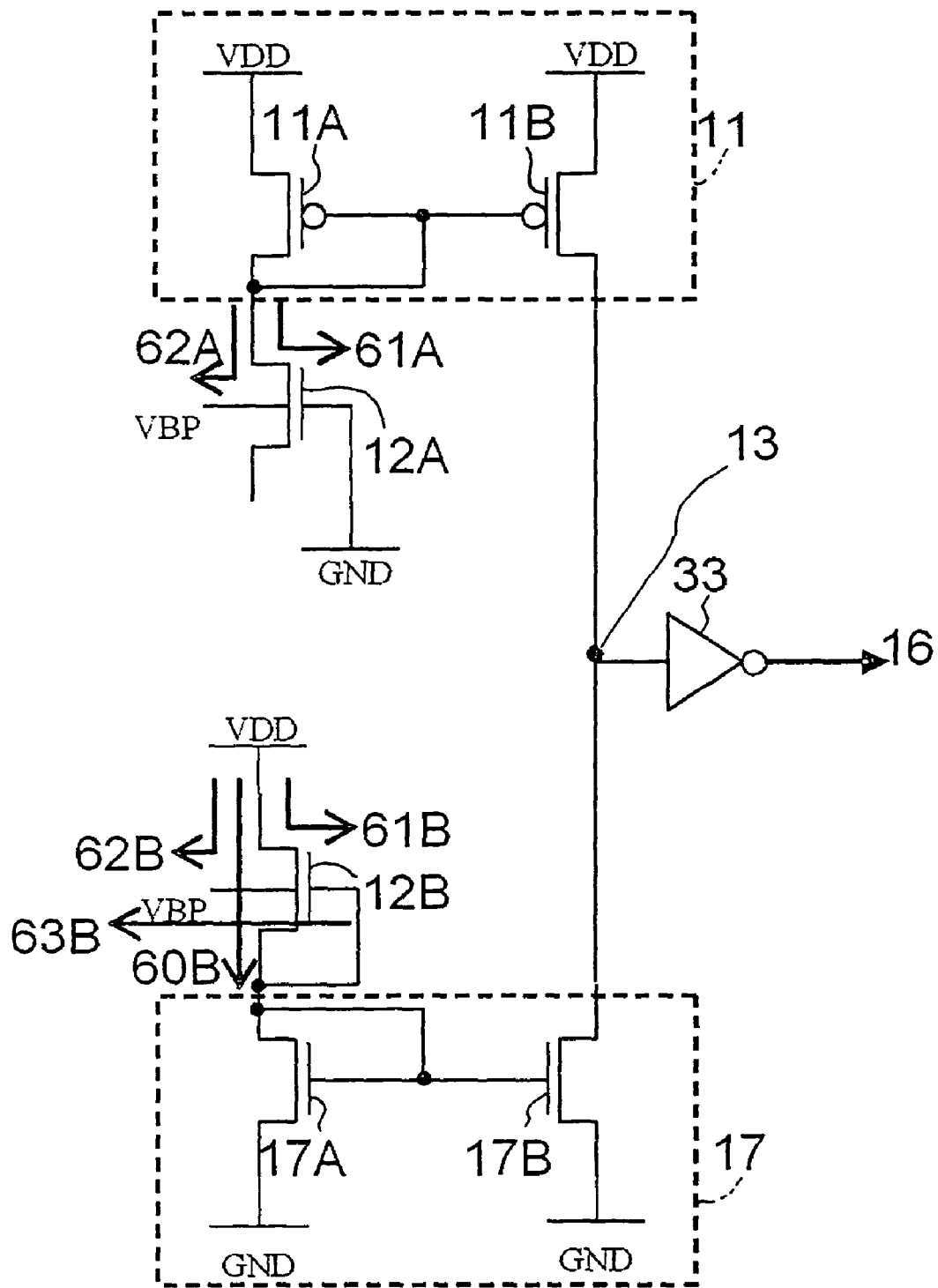
FIG. 11 is a circuit diagram showing a leakage detecting circuit in a third example of the present invention.

FIG. 11 shows the configuration of a leakage detecting circuit according to the example. The leakage detecting circuit is constituted by MOSFETs 11A and 11B constituting a current mirror circuit, MOSFETs 17A and 17B constituting a current mirror circuit 17, leakage detecting MOSFETs 12A and 12B, and an inverter 33.

The MOSFETs 11A and 11B constituting the current mirror circuit 11 are p-type MOSFETs having equal element sizes. The MOSFETs 17A and 17B constituting the current mirror circuit 17 are n-type MOSFETs having equal element sizes.

As the MOSFETs 12A and 12B for detecting leakage currents, elements having the same characteristics as those of elements used in the controlled circuit 5 are used, and the element sizes of the MOSFET 12A and the MOSFET 12B are made equal to each other.

The drain current of the MOSFET 11A is equal to a sum of the inter-drain-substrate current 62A and the inter-drain-gate current 61A of the MOSFET 12A. On the other hand, the drain current of the MOSFET 17A is a current obtained by subtracting an inter-gate-substrate current 63B from a sum of a subthreshold leakage current 60B and an inter-drain-gate current 61B of the MOSFET 12B. Furthermore, the drain current of the MOSFET 11A is subjected to mirroring through the current mirror circuit 11, and the drain current of the MOSFET 17A is subjected to mirroring on the MOSFET 17B through the current mirror circuit 17.

In this case, when a sum of the inter-drain-substrate current 62B and the inter-gate-substrate current 63B is smaller than the subthreshold leakage current 60B, i.e., when the substrate leakage current is smaller than the subthreshold leakage current, the drain current of the MOSFET 11A is larger than the drain current of the MOSFET 17A. At this time, a potential of a node 13 approximates to a low level, and an output 16 from the detecting circuit goes to a high level. In contrast to this, when the sum of the inter-drain-substrate current 62B and the inter-gate-substrate current 63B is larger than the subthreshold leakage current 60B, the potential of the node 13 approximates to a high level, and the output 16 from the detecting circuit goes to a low level.

When a control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

In the circuit configuration, since only the single-stage current mirror circuit is used in the circuit configuration, delay time from a change in leakage current caused by a change in substrate bias to a change in output from a leakage detecting circuit is short. A current consumption is small because of a short current path. In addition, an operational amplifier is not used, so that a current consumption can be considerably reduced.

The example is based on the assumption that the leakage current is minimum at a substrate bias at which the substrate leakage current is equal to the subthreshold leakage current. However, for example, when such element characteristics that the leakage current is minimum when the subthreshold leakage current is n times the substrate leakage current are used, the gate width of the MOSFET 12A is made n times the gate width of the MOSFET 12B to make it possible to control the substrate bias such that the leakage current is minimum.

When the characteristics of the MOSFET 12A and the MOSFET 12B fluctuate, the substrate bias may not be fixed to the bias at which the leakage current is minimum. However, as shown in FIG. 5, a substrate bias dependence of the leakage current is very small near the substrate bias at which the leakage current is minimum. For this reason, even though the substrate bias shifts from an optimum point by about 0.2 V, the advantages of the present invention can be sufficiently achieved.

Furthermore, in the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Fourth Example

An entire circuit configuration of a fourth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 12:
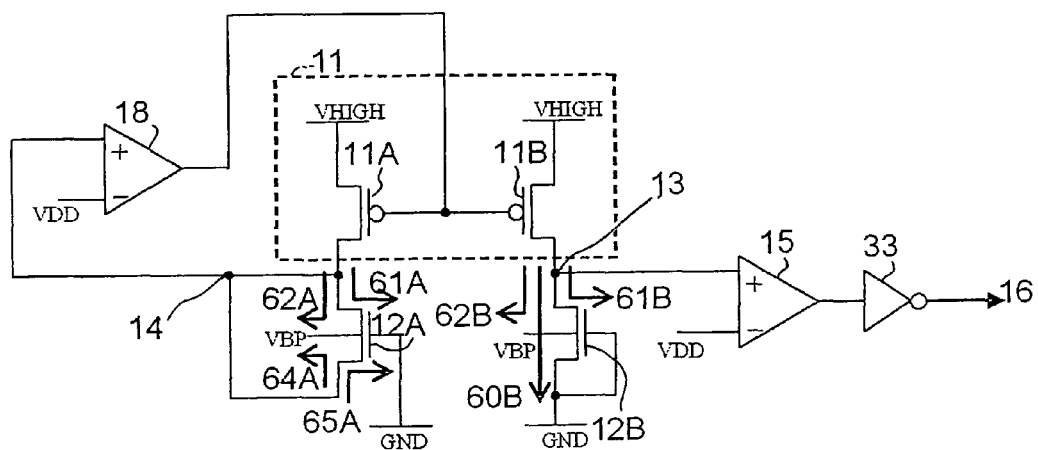
FIG. 12 is a circuit diagram showing a leakage detecting circuit in a fourth example of the present invention.

FIG. 12 shows the configuration of a leakage detecting circuit according to the example. The leakage detecting circuit is constituted by MOSFETs 11A and 11B constituting a current mirror circuit 11, operational amplifiers 18 and 15, an inverter 33, and MOSFETs 12A and 12B.

A power supply voltage VDD is input to an inverted input terminal of the operational amplifier 18. A potential of a node 14 is fixed to the power supply voltage VDD by a feedback loop constituted by the operational amplifier 18 and the MOSFET 11A.

The MOSFETs 11A and 11B constituting the current mirror circuit 11 are p-type MOSFETs having equal element sizes. Furthermore, the source potentials of the MOSFET 11A and the MOSFET 11B are fixed to a potential VHIGH higher than the power supply voltage VDD.

As the MOSFETs 12A and 12B for detecting leakage currents, elements having the same characteristics as those of elements used in the controlled circuit 5 are used, and the element sizes of the MOSFET 12A and the MOSFET 12B are made equal to each other. The drain area and the source area of the MOSFET 12B are made equal to each other.

The drain current of the MOSFET 11A is equal to a sum of an inter-drain-substrate current 62A, an inter-source-substrate current 64A, and an inter-drain-substrate current 61A of the MOSFET 12A. However, since the drain area and the source area are equal to each other, the inter-drain-substrate current 62A and the inter-source-substrate current 64A are equal to each other. On the other hand, the drain current of the MOSFET 11B is equal to a sum of an inter-drain-substrate current 62B, a subthreshold leakage current 60B, and an inter-drain-gate current 61B.

In this case, when the gate leakage current 61A, the inter-drain-gate current 61A, and an inter-source-gate current 65A are sufficiently smaller than the subthreshold leakage current and the substrate leakage current and can be neglected, the potential of the node 13 changes depending on the magnitude relation between the subthreshold leakage current and the substrate leakage current. When the potential of the node 13 is equal to the power supply voltage VDD, if the substrate leakage current is smaller than the subthreshold leakage current, i.e., if the inter-drain-substrate current 62B is smaller than the subthreshold leakage current 60B, the potential of the node 13 becomes lower than the power supply voltage VDD, i.e., the potential of the node 14, and an output 16 goes to a high level. In contrast to this, when the substrate leakage current is larger than the subthreshold leakage current, the potential of the node 13 is higher than the potential of the node 14, and the output 16 from the leakage detecting circuit goes to a low level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the sub-threshold leakage current and the substrate leakage current are equal to each other. At this time, the leakage current is minimum.

In this manner, by using the semiconductor integrated circuit device according to the example, the substrate bias can be controlled such that the leakage current is minimum.

When the substrate bias VBP is fixed, the inter-source-drain voltage of the MOSFET used for detecting leakage in the example is equal to a power supply voltage. For this reason, leakage characteristics of the MOSFET constituting an actual logical circuit or the like in an OFF state can be effectively reflected.

The example is based on the assumption that the leakage current is minimum at the substrate bias at which the substrate leakage current and the subthreshold leakage current are equal to each other. However, for example, when such element characteristics that the leakage current is minimum when the subthreshold leakage current is n times the substrate leakage current are used, the gate width of the MOSFET 12A is made 0.5×(1+n) times the gate width of the MOSFET 12B to make it possible to control the substrate bias such that the leakage current is minimum. When the gate width of the MOSFET 11B constituting the current mirror circuit is made 0.5×(1+n) times the gate width of the MOSFET 11A while keeping the gate widths of the MOSFET 12A and the MOSFET 12B equal to each other, the advantages of the present invention can be obtained.

When the characteristics of the MOSFET 12A and the MOSFET 12B fluctuate, the substrate bias may not be fixed to the bias at which the leakage current is minimum. However, as shown in FIG. 5, a substrate bias dependence of the leakage current is very small near the substrate bias at which the leakage current is minimum. For this reason, even though the substrate bias shifts from an optimum point by about 0.2 V, the advantages of the present invention can be sufficiently achieved.

Furthermore, the drain area and the source area of the MOSFET 12A are made equal to each other in the example. However, the drain area and the source area of the MOSFET 12A are not necessarily equal to each other, and a sum of the drain area and the source area of the MOSFET 12A may be merely twice the drain area of the MOSFET 12B. Alternatively, a sum of the inter-drain-substrate current 62A and the inter-source-substrate current 64A when the drain potential of the MOSFET 12A and the drain potential of the MOSFET 12B are equal to each other may be merely twice the inter-drain-substrate current 62B.

In the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Figure 13:
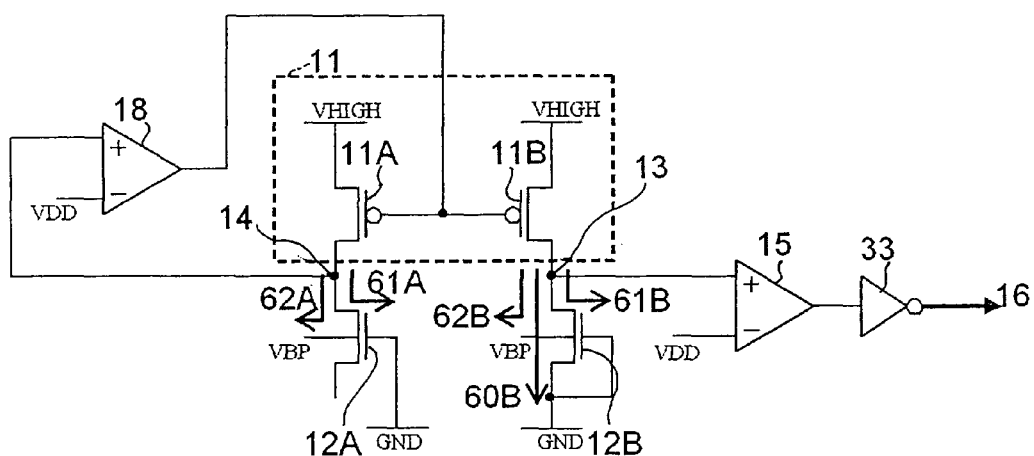
FIG. 13 is a circuit diagram showing the leakage detecting circuit in the fourth example of the present invention.

As shown in FIG. 13, when the source and the drain of the MOSFET 12A are disconnected from each other to float the source, and when the gate width of the MOSFET 11B constituting the current mirror circuit 11 is made twice the gate width of the MOSFET 11A, the advantages of the present invention can be achieved.

Figure 14:
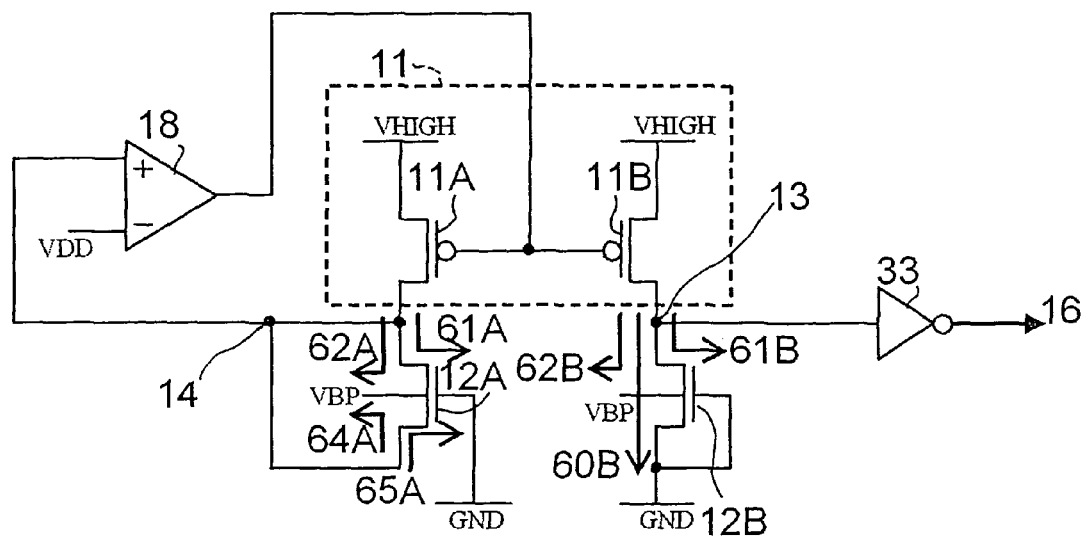
FIG. 14 is a circuit diagram showing the leakage detecting circuit in the fourth example of the present invention.

When a logical threshold value of the inverter 33 is equal to a power supply voltage, as shown in FIG. 14, the advantages of the present invention can be obtained even in a circuit configuration in which an operational amplifier for comparing potentials with each other. In this case, since the operational amplifier is not used, an operation current can be reduced.

Fifth Example

An entire circuit configuration of a fifth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 15:
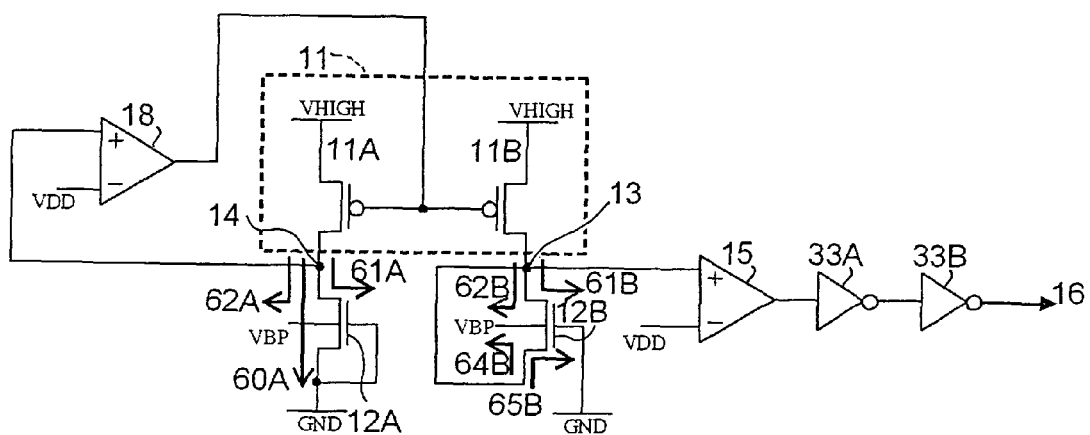
FIG. 15 is a circuit diagram showing a leakage detecting circuit in a fifth example of the present invention.

FIG. 15 shows the configuration of a leakage detecting circuit according to the example. The leakage detecting circuit is constituted by MOSFETs 11A and 11B constituting a current mirror circuit 11, operational amplifiers 18 and 15, inverters 33A and 33B, and leakage detecting MOSFETs 12A and 12B.

A power supply voltage VDD is input to an inverted input terminal of the operational amplifier 18. A potential of a node 14 is fixed to the power supply voltage VDD by a feedback loop constituted by the operational amplifier 18 and the MOSFET 11A. The power supply voltage VDD is input to the inverted input terminal of the operational amplifier 15.

The MOSFETs 11A and 11B constituting the current mirror circuit 11 are p-type MOSFETs having equal element sizes. Furthermore, the source potentials of the MOSFET 11A and the MOSFET 11B are fixed to a potential VHIGH higher than the power supply voltage VDD.

As the MOSFETs 12A and 12B for detecting leakage currents, elements having the same characteristics as those of elements used in the controlled circuit 5 are used, and the element sizes of the MOSFET 12A and the MOSFET 12B are made equal to each other. The drain area and the source area of the MOSFET 12B are made equal to each other.

The drain current of the MOSFET 11B is equal to a sum of an inter-drain-substrate current 62B, an inter-source-substrate current 64B, an inter-drain-substrate current 61B, and an inter-source-gate current 65B of the MOSFET 12B. However, since the drain area and the source area are equal to each other, the inter-drain-substrate current 62B and the inter-source-substrate current 64B are equal to each other. On the other hand, the drain current of the MOSFET 11A is equal to a sum of an inter-drain-substrate current 62A, a subthreshold leakage current 60A, and an inter-drain-gate current 61A.

In this case, when the gate leakage current 61A, the inter-drain-substrate current 61B, and an inter-source-gate current 65B are sufficiently smaller than the subthreshold leakage current and the substrate leakage current and can be neglected, if the substrate leakage current is smaller than the subthreshold leakage current, i.e., if the inter-drain-substrate current 62A is smaller than the subthreshold leakage current 60A, a potential of a node 13 becomes higher than the power supply voltage VDD, i.e., a potential of a node 14, and an output 16 from a leakage detecting circuit goes to a high level. In contrast to this, when the substrate leakage current is larger than the subthreshold leakage current, the potential of the node 13 becomes lower than the potential of the node 14, and the output 16 from the leakage detecting circuit goes to a low level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

Since the inter-source-drain voltage of the MOSFET used for detecting leakage in the example is equal to a power supply voltage, leakage characteristics of the MOSFET constituting an actual logical circuit or the like in an OFF state can be effectively reflected.

The example is based on the assumption that the leakage current is minimum at the substrate bias at which the substrate leakage current and the subthreshold leakage current are equal to each other. However, for example, when such element characteristics that the leakage current is minimum when the subthreshold leakage current is n times the substrate leakage current are used, the gate width of the MOSFET 12B is made 0.5×(1+n) times the gate width of the MOSFET 12A to make it possible to control the substrate bias such that the leakage current is minimum. When the gate width of the MOSFET 11A constituting the current mirror circuit is made 0.5×(1+n) times the gate width of the MOSFET 11B while keeping the gate widths of the MOSFET 12A and the MOSFET 12B equal to each other, the advantages of the present invention can be obtained.

When the characteristics of the MOSFET 12A and the MOSFET 12B fluctuate, the substrate bias may not be fixed to the bias at which the leakage current is minimum. However, as shown in FIG. 5, a substrate bias dependence of the leakage current is very small near the substrate bias at which the leakage current is minimum. For this reason, even though the substrate bias shifts from an optimum point by about 0.2 V, the advantages of the present invention can be sufficiently achieved.

Furthermore, the drain area and the source area of the MOSFET 12B are made equal to each other in the example. However, the drain area and the source area of the MOSFET 12B are not necessarily equal to each other, and a sum of the drain area and the source area of the MOSFET 12B may be merely twice the drain area of the MOSFET 12A. Alternatively, a sum of the inter-drain-substrate current 62B and the inter-source-substrate current 64B when the drain potential of the MOSFET 12A and the drain potential of the MOSFET 12B are equal to each other may be merely twice the inter-drain-substrate current 62A.

In the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Figure 16:
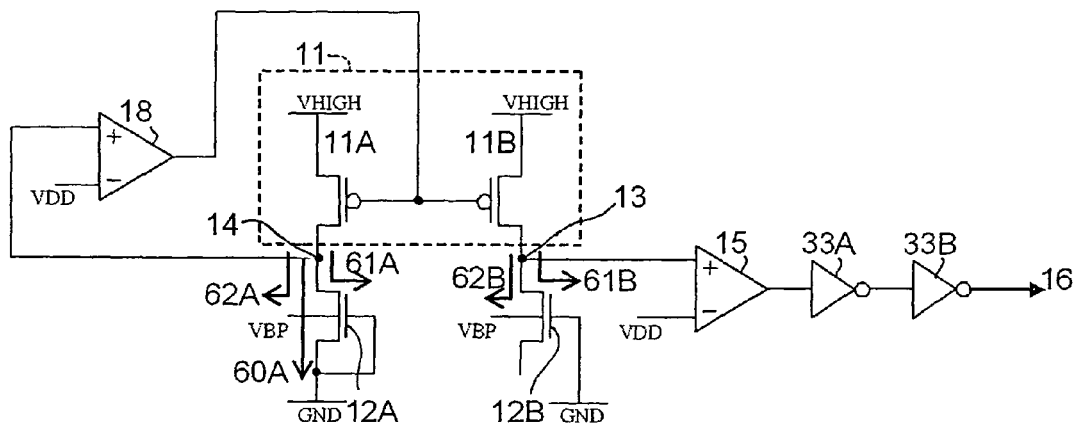
FIG. 16 is a circuit diagram showing the leakage detecting circuit in the fifth example of the present invention.

As shown in FIG. 16, when the source and the drain of the MOSFET 12A are disconnected from each other to float the source, and when the gate width of the MOSFET 11A constituting the current mirror circuit 11 is made twice the gate width of the MOSFET 11B, the advantages of the present invention can be achieved.

Figure 17:
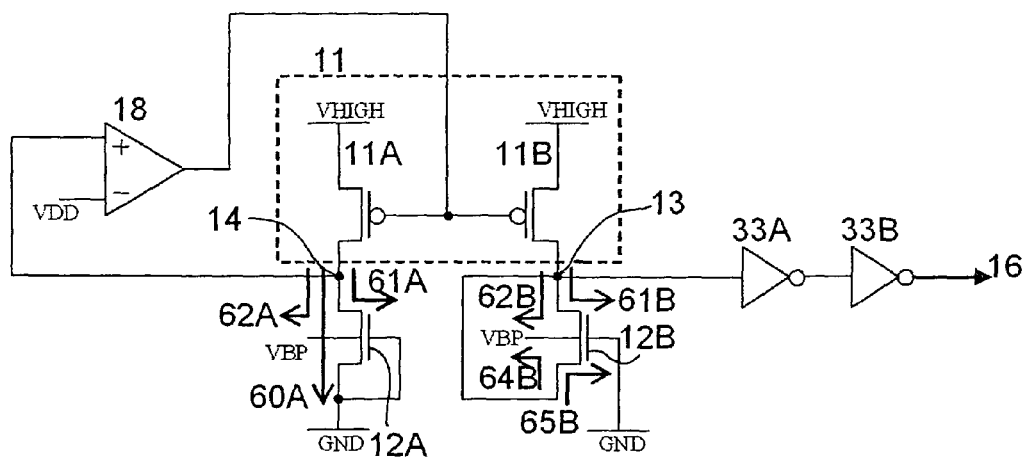
FIG. 17 is a circuit diagram showing the leakage detecting circuit in the fifth example of the present invention.

When a logical threshold value of the inverter 33A is equal to a power supply voltage, the advantages of the present invention can be obtained even in a circuit configuration in FIG. 17 in which the operational amplifier in FIG. 15 is omitted. In this case, since the operational amplifier is not used, an operation current can be reduced.

Sixth Example

An entire circuit configuration of a sixth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 18:
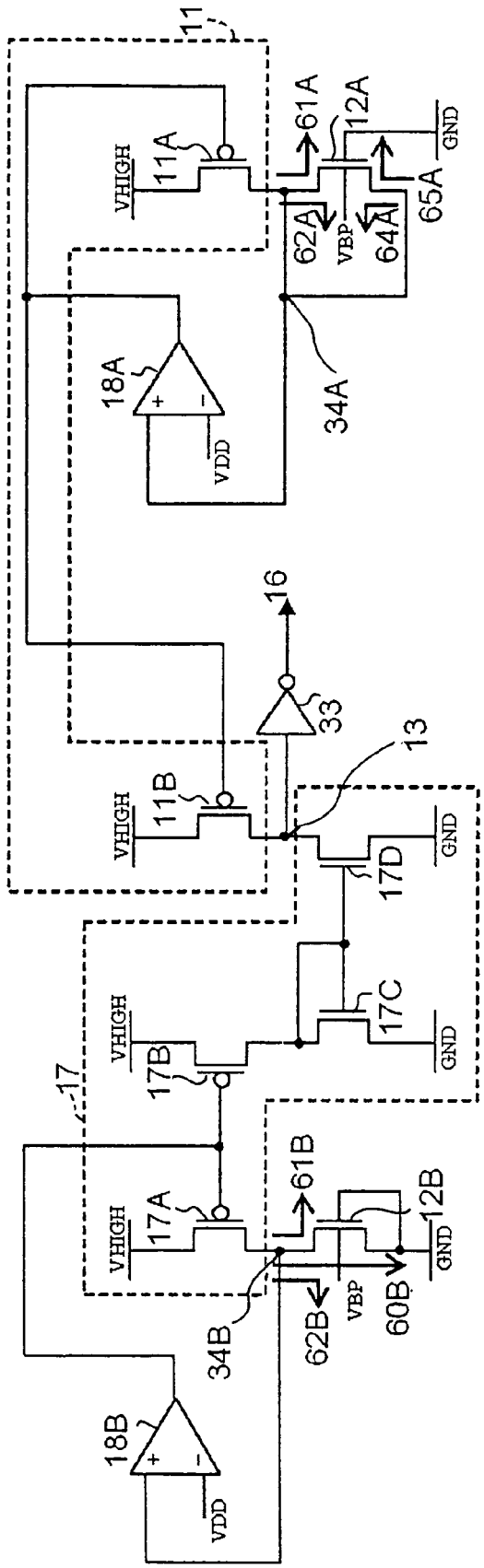
FIG. 18 is a circuit diagram showing a leakage detecting circuit in a sixth example of the present invention.

FIG. 18 shows the configuration of a leakage detecting circuit according to the example. The leakage detecting circuit is constituted by current mirror circuits 11 and 17, operational amplifiers 18A and 18B, leakage detecting MOSFETs 12A and 12B, and an inverter 33.

The MOSFETs 11A and 11B constituting the current mirror circuit 11 are p-type MOSFETs having equal element sizes. MOSFETs 17A and 17B constituting the current mirror circuit 17 are n-type MOSFETs having equal element sizes. Furthermore, the source potentials of the MOSFETs 11A, 11B, 17A, and 17B are fixed to a potential VHIGH higher than a power supply voltage VDD.

The power supply voltage VDD is input to an inverted input terminal of the operational amplifier 18A. A potential of a node 34A is kept at the power supply voltage VDD by a feedback loop constituted by the operational amplifier 18A and the MOSFET 11A. A ground potential GND is input to an inverted input terminal of the operational amplifier 18B, and a potential of a node 34B is kept at the power supply voltage VDD by a feedback loop constituted by the operational amplifier 18B and the MOSFET 17A.

As the MOSFETs 12A and 12B for detecting leakage currents, elements having the same characteristics as those of elements used in the controlled circuit 5 are used, and the element sizes of the MOSFET 12A and the MOSFET 12B are made equal to each other. The drain area and the source area of the MOSFET 12B are made equal to each other.

The drain current of the MOSFET 11A is equal to a sum of an inter-drain-substrate current 62A, an inter-source-substrate current 64A, an inter-drain-gate current 61A, and an inter-source-gate current 65A of the MOSFET 12A. However, since the drain area and the source area are equal to each other, the inter-drain-substrate current 62A and the inter-source-substrate current 64A are equal to each other. On the other hand, the drain current of the MOSFET 17A is equal to a sum of an inter-drain-substrate current 62B of the MOSFET 12B, a subthreshold leakage current 60B, and an inter-drain-gate current 61B. Furthermore, drain currents of the MOSFET 11A and the MOSFET 17A are subjected to mirroring by the current mirror circuits 11 and 17, respectively, and serve as currents flowing in the node 13.

In this case, when the gate leakage currents 61A, 61B, and 65A are sufficiently smaller than the subthreshold leakage current and the substrate leakage current and can be neglected, if the substrate leakage current is smaller than the subthreshold leakage current, i.e., if the inter-drain-substrate current 62B is smaller than the subthreshold leakage current 60B, a potential of a node 13 goes to a low level, and an output 16 from a leakage detecting circuit goes to a high level. In contrast to this, when the substrate leakage current is larger than the subthreshold leakage current, the potential of the node 13 goes to a high level, and the output 16 from the leakage detecting circuit goes to a low level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

Since the inter-source-drain voltage of the MOSFET used for detecting leakage in the example is equal to a power supply voltage, leakage characteristics of the MOSFET constituting an actual logical circuit or the like in an OFF state can be effectively reflected.

The example is based on the assumption that the leakage current is minimum at the substrate bias at which the substrate leakage current and the subthreshold leakage current are equal to each other. However, for example, when such element characteristics that the leakage current is minimum when the subthreshold leakage current is n times the substrate leakage current are used, the gate width of the MOSFET 12A is made 0.5×(1+n) times the gate width of the MOSFET 12B to make it possible to control the substrate bias such that the leakage current is minimum.

Furthermore, the drain area and the source area of the MOSFET 12A are made equal to each other in the example. However, the drain area and the source area of the MOSFET 12A are not necessarily equal to each other, and a sum of the drain area and the source area of the MOSFET 12A may be merely twice the drain area of the MOSFET 12B. Alternatively, a sum of the inter-drain-substrate current 62A and the inter-source-substrate current 64A when the drain potential of the MOSFET 12A and the drain potential of the MOSFET 12B are equal to each other may be merely twice the inter-drain-substrate current 62B.

When the characteristics of the MOSFET 12A and the MOSFET 12B fluctuate, the substrate bias may not be fixed to the bias at which the leakage current is minimum. However, as shown in FIG. 5, a substrate bias dependence of the leakage current is very small near the substrate bias at which the leakage current is minimum. For this reason, even though the substrate bias shifts from an optimum point by about 0.2 V, the advantages of the present invention can be sufficiently achieved.

In the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Figure 19:
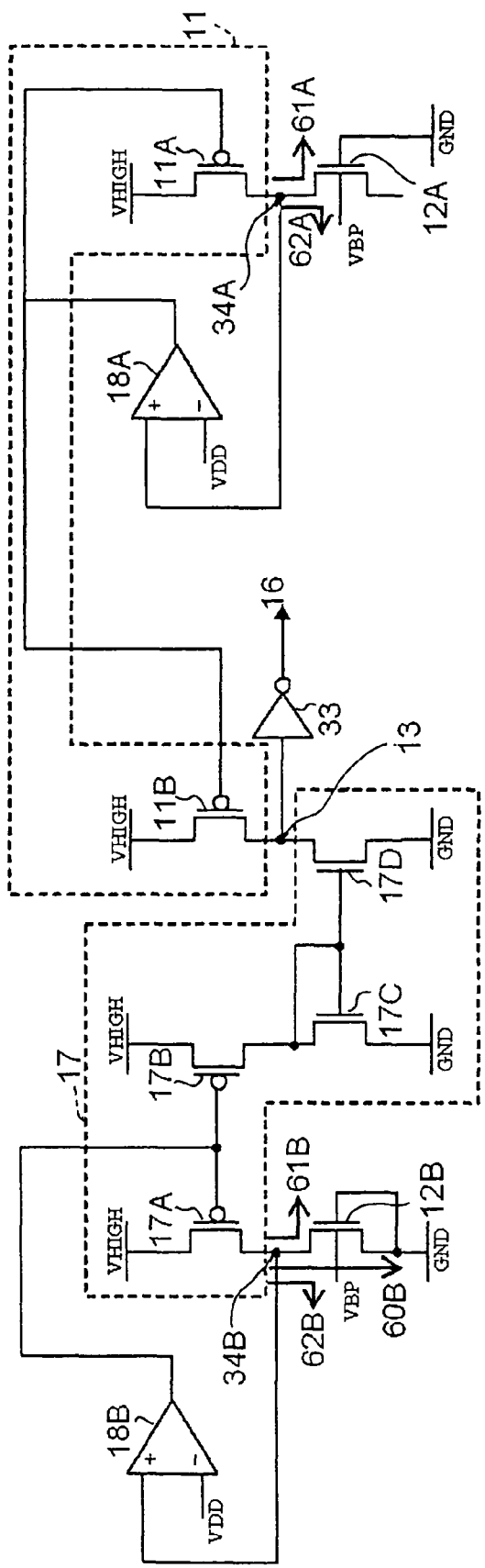
FIG. 19 is a circuit diagram showing the leakage detecting circuit in the sixth example of the present invention.

As shown in FIG. 19, when the source and the drain of the MOSFET 12A are disconnected from each other to float the source, and when the gate width of the MOSFET 12A is made twice the gate width of the MOSFET 12B, the advantages of the present invention can be achieved.

Seventh Example

An entire circuit configuration of a seventh example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 20:
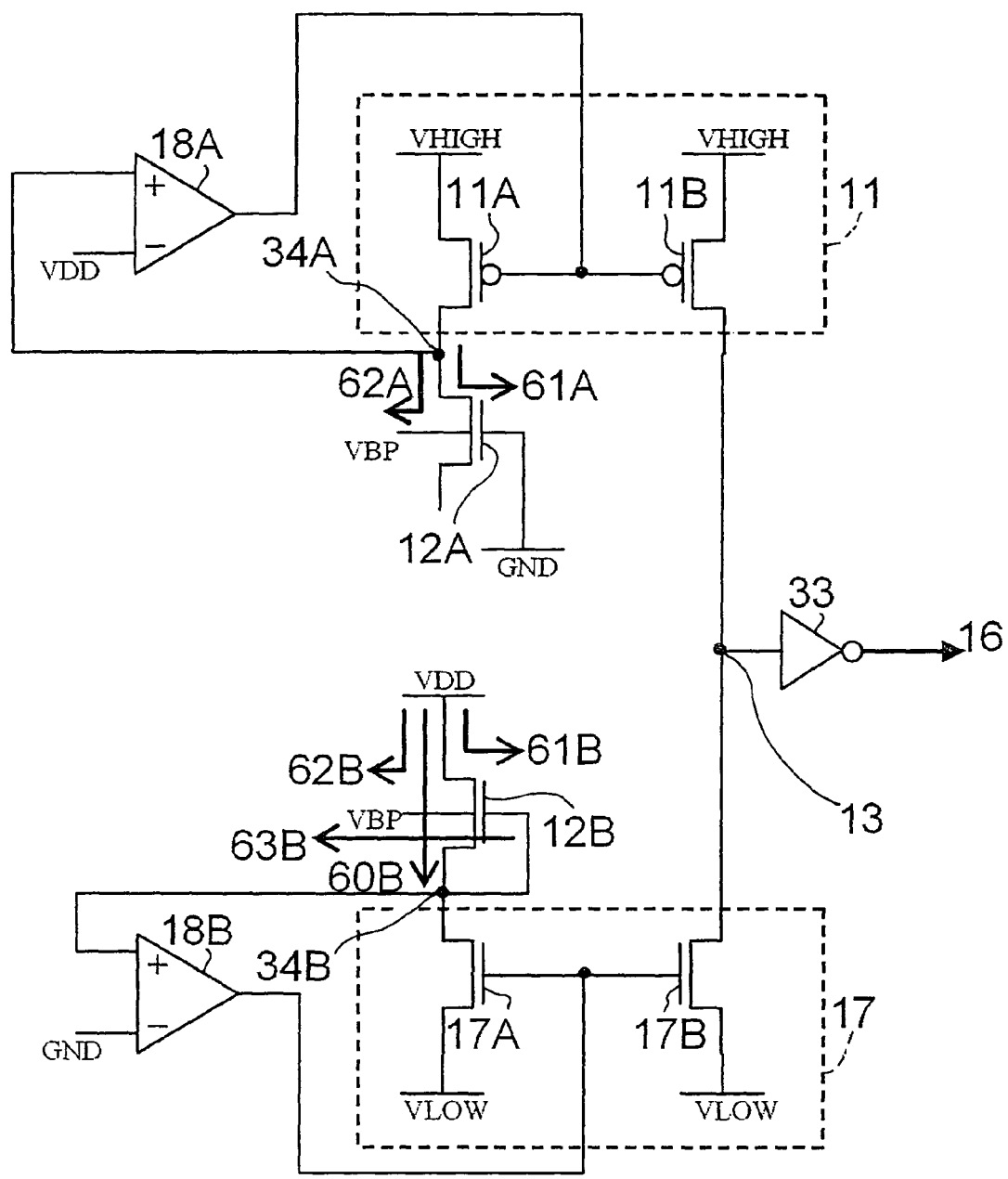
FIG. 20 is a circuit diagram showing a leakage detecting circuit in a seventh example of the present invention.

FIG. 20 shows the configuration of a leakage detecting circuit according to the example. The leakage detecting circuit is constituted by current mirror circuits 11 and 17, operational amplifiers 18A and 18B, leakage detecting MOSFETs 12A and 12B, and an inverter 33.

The MOSFETs 11A and 11B constituting the current mirror circuit 11 are p-type MOSFETs having equal element sizes. MOSFETs 17A and 17B constituting the current mirror circuit 17 are n-type MOSFETs having equal element sizes. Furthermore, the source potentials of the MOSFETs 11A and 11B are fixed to a potential VHIGH higher than a power supply voltage VDD. The source potentials of the MOSFETs 17A and 17B are fixed to a potential VLOW lower than a ground potential GND.

The power supply voltage VDD is input to an inverted input terminal of the operational amplifier 18A. A potential of a node 34A is kept at the power supply voltage VDD by a feedback loop constituted by the operational amplifier 18A and the MOSFET 11A. The ground potential GND is input to an inverted input terminal of the operational amplifier 18B, and a potential of a node 34B is kept at the ground potential GND by a feedback loop constituted by the operational amplifier 18B and the MOSFET 17A.

As the MOSFETs 12A and 12B for detecting leakage currents, elements having the same characteristics as those of elements used in the controlled circuit 5 are used, and the element sizes of the MOSFET 12A and the MOSFET 12B are made equal to each other.

The drain current of the MOSFET 11A is equal to a sum of an inter-drain-substrate current 62A and an inter-drain-gate current 61A of the MOSFET 12A. On the other hand, the drain current of the MOSFET 17A is a current obtained by subtracting an inter-gate-substrate current 63B from a sum of a subthreshold leakage current 60B and an inter-drain-gate current 61B of the MOSFET 12B. Furthermore, the drain current of the MOSFET 11A is subjected to mirroring for the MOSFET 11B, and the drain current of the MOSFET 17A is subjected to mirroring for the MOSFET 17B.

In this case, when a sum of the inter-drain-substrate current 62B and the inter-gate-substrate current 63B is smaller than the subthreshold leakage current 60B, i.e., when the substrate leakage current is smaller than the subthreshold leakage current, the potential of the node 13 approximates to a low level, and an output 16 from the detecting circuit goes to a high level. In contrast to this, when the substrate leakage current is larger than the subthreshold leakage current, the potential of the node 13 approximates to a high level, and the output 16 from the detecting circuit goes to a low level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the sub-threshold leakage current and the substrate leakage current are equal to each other. At this time, the leakage current is minimum.

In this manner, by using the semiconductor integrated circuit device according to the example, the substrate bias can be controlled such that the leakage current is minimum.

Since the inter-source-drain voltage of the MOSFET used for detecting leakage in the example is equal to a power supply voltage, leakage characteristics of the MOSFET constituting an actual logical circuit or the like in an OFF state can be effectively reflected.

Furthermore, since the inter-drain-gate currents flowing in the MOSFET 12A and the MOSFET 12B are equal to each other, a ratio of the inter-drain-gate currents to all the leakage currents cannot be neglected. In this case, the influence of the inter-drain-gate currents can be canceled, and a detection error can be made very small.

In the example, the potential of the node 13 changes from a high level to a low level depending on magnitude relation between the substrate leakage current and the subthreshold leakage current including the gate-substrate current, so that the detection error can be made very small even though the inter-gate-substrate current is so large that the inter-gate-substrate current cannot be neglected.

In the circuit configuration, since only the single-stage current mirror circuit is used in the circuit configuration, delay time from a change in leakage current caused by a change in substrate bias to a change in output from a leakage detecting circuit is short. A current consumption is small because of a short current path. In addition, an operational amplifier is not used, so that a current consumption can be considerably reduced.

The example is based on the assumption that the leakage current is minimum at a substrate bias at which the substrate leakage current is equal to the subthreshold leakage current. However, for example, when such element characteristics that the leakage current is minimum when the subthreshold leakage current is n times the substrate leakage current are used, the gate width of the MOSFET 12A is made n times the gate width of the MOSFET 12B to make it possible to control the substrate bias such that the leakage current is minimum. In this case, when the ratio of the inter-drain-gate current and the inter-gate-substrate current to the substrate leakage current is so large that the ratio cannot be neglected, a detection error of the leakage current becomes large.

When the characteristics of the MOSFET 12A and the MOSFET 12B fluctuate, the substrate bias may not be fixed to the bias at which the leakage current is minimum. However, as shown in FIG. 5, a substrate bias dependence of the leakage current is very small near the substrate bias at which the leakage current is minimum. For this reason, even though the substrate bias shifts from an optimum point by about 0.2 V, the advantages of the present invention can be sufficiently achieved.

The inter-source-substrate current is sufficiently smaller than the inter-drain-substrate current in general, the influence of the inter-source-substrate current can be neglected. However, even though the influence is so large that the influence cannot be neglected, since a circuit configuration in which a sum of the inter-drain-substrate current, the inter-source-substrate current, and the inter-gate-substrate current can be compared with the subthreshold leakage current, a leakage detecting accuracy does not deteriorate.

Figure 21:
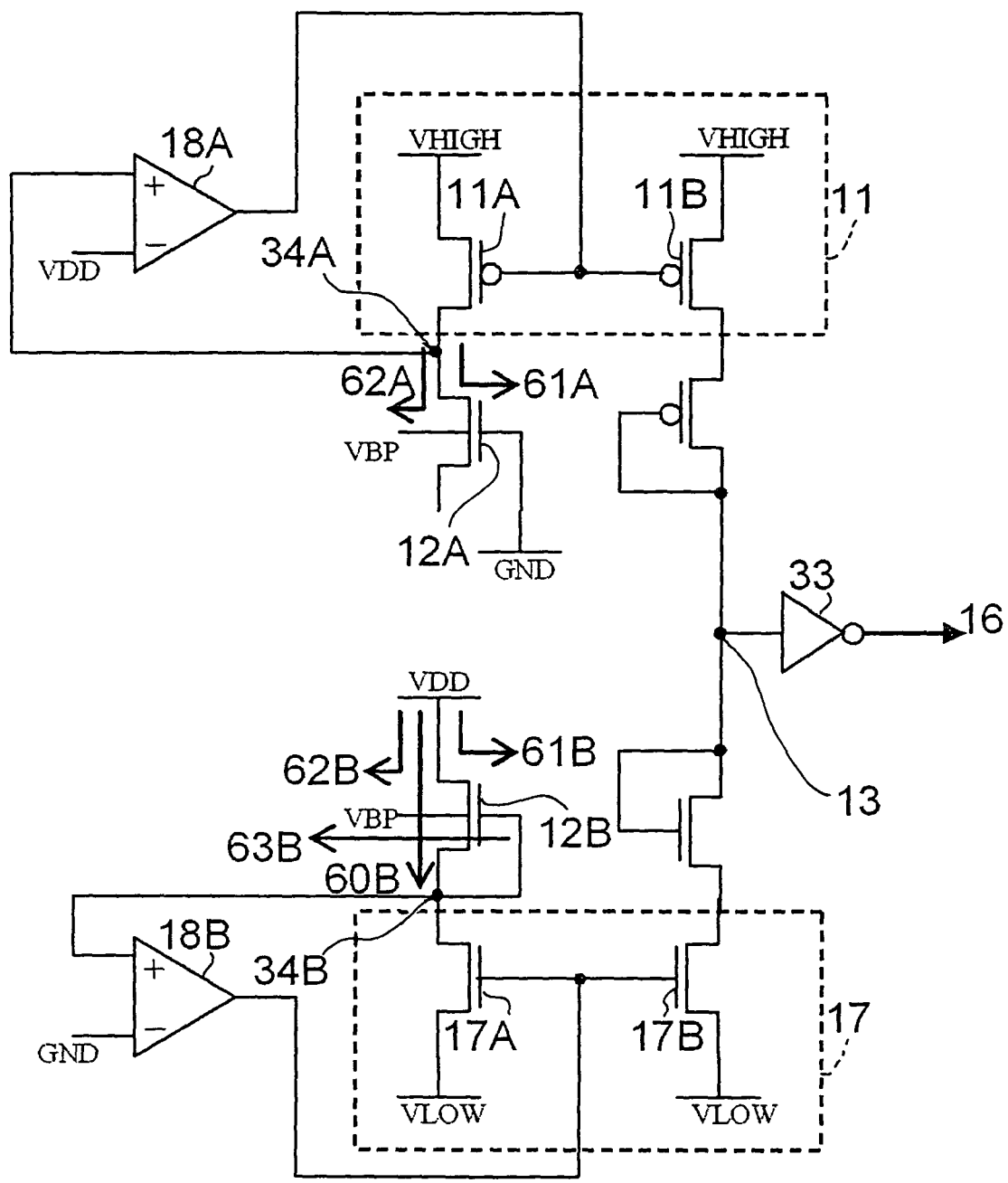
FIG. 21 is a circuit diagram showing the leakage detecting circuit in the seventh example of the present invention.

In the example, the potential of the node 13 changes from VLOW to VHIGH depending on an operation state of the circuit. When a withstand voltage of an element is posed as a problem, as shown in FIG. 21, an arbitrary number of p-type MOSFETs or n-type MOSFETs are inserted in series between the MOSFET 11B and the MOSFET 17B to make it possible to reduce a change in potential of the node 13. In this case, the advantages of the present invention are not deteriorated.

Figure 22:
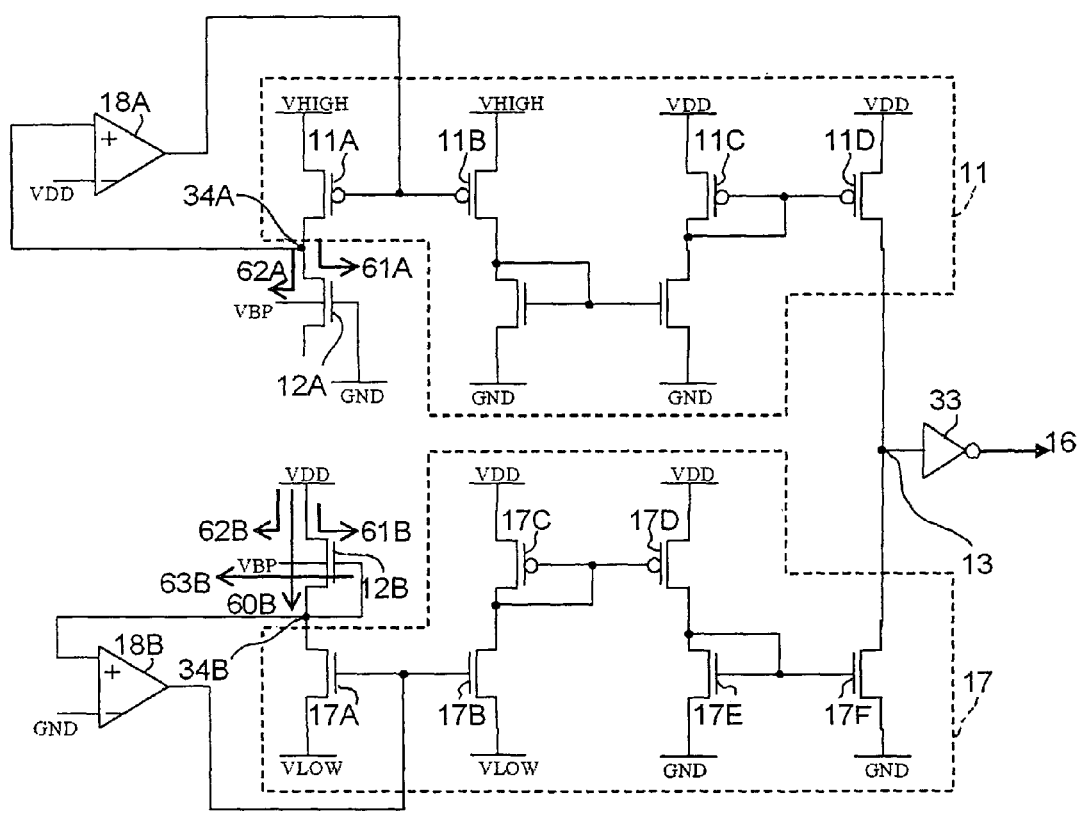
FIG. 22 is a circuit diagram showing the leakage detecting circuit in the seventh example of the present invention.

As shown in FIG. 22, the current mirror circuits 11 and 17 are arranged in multistages, respectively, the source potentials of the MOSFETs 11A and 11B are fixed to the potential VHIGH, the source potentials of MOSFETs 11C and 11D are fixed to a power supply voltage VDD, the source potentials of the MOSFETs 17A and 17B are fixed to the potential VLOW, the source potentials of MOSFETs 17E and 17F are fixed to the ground potential GND, so that the change in potential of the node 13 can be made lower than the power supply voltage. Even in this case, the advantages of the present invention are not deteriorated.

Figure 23:
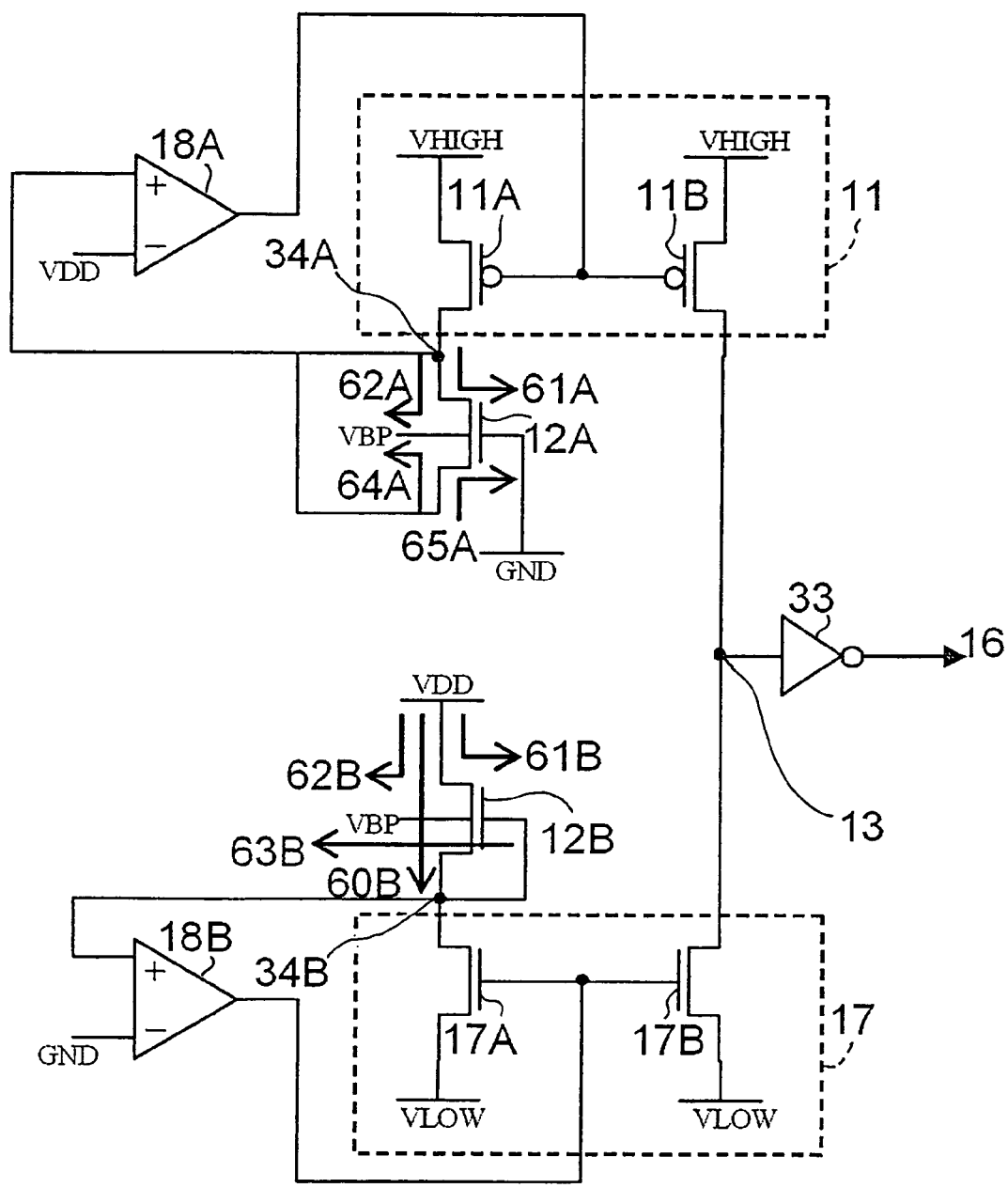
FIG. 23 is a circuit diagram showing the leakage detecting circuit in the seventh example of the present invention.

In the example, when the element sizes of the MOSFET 12A and the MOSFET 12B are made equal to each other, and the source of the MOSFET 12A is floated. However, the gate width of the MOSFET 12B is made twice the gate width of the MOSFET 12A, and, as shown in FIG. 23, the drain and the source of the MOSFET 12A can be connected to each other. Even in the circuit configuration, the advantages of the present invention can be achieved.

Eighth Example

An entire circuit configuration of an eighth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 24:
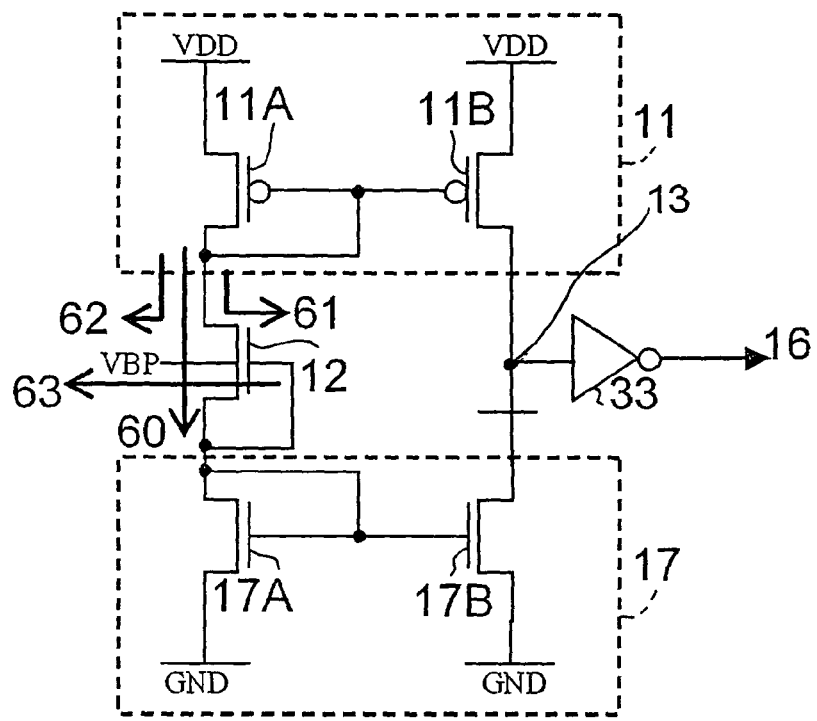
FIG. 24 is a circuit diagram showing a leakage detecting circuit in an eighth example of the present invention.

FIG. 24 shows the configuration of a leakage detecting circuit according to the example. The leakage detecting circuit is constituted by current mirror circuits 11 and 17, a leakage detecting MOSFET 12, and an inverter 33.

The MOSFETs 11A and 11B constituting the current mirror circuit 11 are p-type MOSFETs having equal element sizes. MOSFETs 17A and 17B constituting the current mirror circuit 17 are n-type MOSFETs having equal element sizes. The gate width of the MOSFET 17B is twice the gate width of the MOSFET 17A.

As the MOSFET 12 for detecting a leakage current, an element having the same characteristics as those of the element used in the controlled circuit 5 is used.

The drain current of the MOSFET 11A is equal to a sum of a subthreshold leakage current 60, an inter-drain-substrate current 62, and an inter-drain-gate current 61 of the MOSFET 12. On the other hand, the drain current of the MOSFET 17A is a current obtained by subtracting an inter-gate-substrate current 63 from a sum of the subthreshold leakage current 60 and an inter-drain-gate current 61 of the MOSFET 12. Furthermore, the drain current of the MOSFET 11A is subjected to mirroring for the MOSFET 11B, and the drain current of the MOSFET 17A is subjected to mirroring for the MOSFET 17B.

In this case, when the inter-drain-gate current 61 and the inter-gate-substrate current 63 are sufficiently smaller than the subthreshold leakage current and the substrate leakage current and can be neglected, if the inter-drain-substrate current 62 is smaller than the subthreshold leakage current 60, a potential of a node 13 approximates to a low level, and an output 16 from the detecting circuit goes to a high level. In contrast to this, when the inter-drain-substrate current 62 is larger than the subthreshold leakage current 60, the potential of the node 13 approximates to a high level, and the output 16 from the detecting circuit goes to a low level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

In the circuit configuration, an operational amplifier is not used, so that a current consumption can be considerably reduced.

Furthermore, in the circuit configuration, since the subthreshold leakage current and the substrate leakage current are detected from the same leakage detecting MOSFET, a detection error caused by a fluctuation in characteristic of leakage detecting MOSFETs can be eliminated.

The example is based on the assumption that the leakage current is minimum at a substrate bias at which the substrate leakage current is equal to the subthreshold leakage current. However, for example, when such element characteristics that the leakage current is minimum when the subthreshold leakage current is n times the substrate leakage current are used, the gate width of the MOSFET 17B is made (n+1) times the gate width of the MOSFET 17A to make it possible to control the substrate bias such that the leakage current is minimum.

In the example, the substrate leakage current-used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Ninth Example

An entire circuit configuration of a ninth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 25:
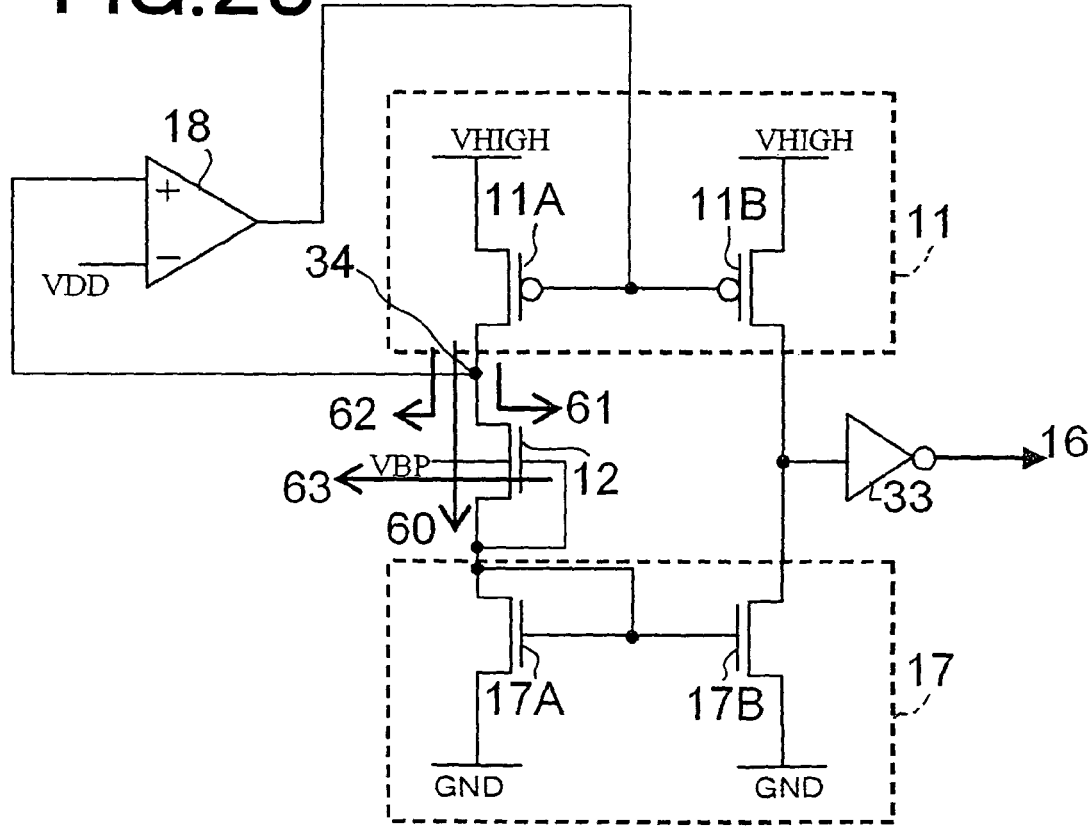
FIG. 25 is a circuit diagram showing a leakage detecting circuit in a ninth example of the present invention.

FIG. 25 shows the configuration of a leakage detecting circuit according to the example. The leakage detecting circuit is constituted by current mirror circuits 11 and 17, an operational amplifier 18, a leakage detecting MOSFET 12, and an inverter 33.

MOSFETs 11A and 11B constituting the current mirror circuit 11 are p-type MOSFETs having equal element sizes. The source potentials of the MOSFETs 11A and 11B are fixed to a potential VHIGH higher than a power supply voltage VDD.

MOSFETs 17A and 17B constituting the current mirror circuit 17 are n-type MOSFETs, and a gate width of the MOSFET 17B is twice a gate width of the MOSFET 17A.

The power supply voltage VDD is input to an inverted input terminal of the operational amplifier 18. A potential of a node 34A is kept at the power supply voltage VDD by a feedback loop constituted by the operational amplifier 18 and the MOSFET 11A.

As the MOSFET 12 for detecting a leakage current, an element having the same characteristics as those of the element used in the controlled circuit 5 is used.

The drain current of the MOSFET 11A is equal to a sum of a subthreshold leakage current 60, an inter-drain-substrate current 62, and an inter-drain-gate current 61 of the MOSFET 12. On the other hand, the drain current of the MOSFET 17A is equal to a sum of the inter-drain-gate current 61 and an inter-gate-substrate current 63 of the MOSFET 12. Furthermore, the drain current of the MOSFET 11A is subjected to mirroring for the MOSFET 11B, and the drain current of the MOSFET 17A is subjected to mirroring for the MOSFET 17B.

In this case, when the gate leakage currents 62 and 63 are sufficiently smaller than the subthreshold leakage current and the substrate leakage current and can be neglected, if the substrate leakage current 62 is smaller than the subthreshold leakage current 60, a potential of a node 34 approximates to a low level, and an output 16 from a leakage detecting circuit goes to a high level. In contrast to this, when the substrate leakage current 62 is larger than the subthreshold leakage current 60, the potential of the node 34 approximates to a high level, and the output 16 from the leakage detecting circuit goes to a low level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

Since the drain potential of the MOSFET 12 used for detecting leakage in the example is fixed to the power supply voltage VDD, the inter-source-drain voltage of the MOSFET 12 is close to the power supply voltage, equal to a power supply voltage, and effectively reflects leakage characteristics of the MOSFET constituting an actual logical circuit or the like in an OFF state.

In the circuit configuration, an operational amplifier is not used, so that a current consumption can be considerably reduced.

Furthermore, in the example, since the subthreshold leakage current and the substrate leakage current are detected from the same leakage detecting MOSFET, a detection error caused by a fluctuation in characteristic of leakage detecting MOSFETs can be eliminated.

The example is based on the assumption that the leakage current is minimum at a substrate bias at which the substrate leakage current is equal to the subthreshold leakage current. However, for example, when such element characteristics that the leakage current is minimum when the subthreshold leakage current is n times the substrate leakage current are used, the gate width of the MOSFET 17B is made (n+1) times the gate width of the MOSFET 17A to make it possible to control the substrate bias such that the leakage current is minimum.

In the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

In the example, the sources of the MOSFETs 17A and 17B constituting the current mirror circuit 17 are fixed to the ground potential GND. However, the sources may be fixed to a potential lower than the ground potential. At this time, the inter-source-drain voltage of the MOSFET 12 can be made close to the power supply voltage, and the advantages of the present invention can be further improved.

Tenth Example

An entire circuit configuration of a tenth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 26:
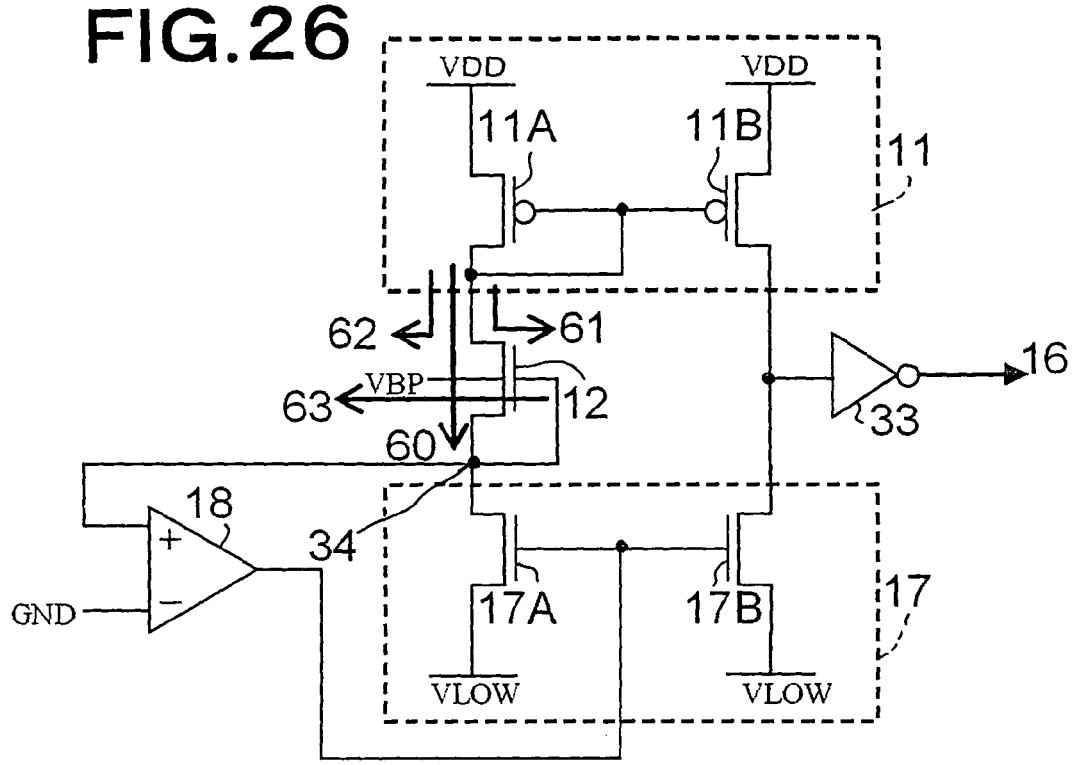
FIG. 26 is a circuit diagram showing a leakage detecting circuit in a tenth example of the present invention.

FIG. 26 shows the configuration of a leakage detecting circuit according to the example. The leakage detecting circuit is constituted by current mirror circuits 11 and 17, an operational amplifier 18, a leakage detecting MOSFET 12, and an inverter 33.

MOSFETs 11A and 11B constituting the current mirror circuit 11 are p-type MOSFETs having equal element sizes. The source potentials of the MOSFETs 11A and 11B are fixed to a power supply voltage VDD. The MOSFETs 17A and 17B constituting the current mirror circuit 17 are n-type MOSFETs, and the gate width of the MOSFET 17B is twice the gate width of the MOSFET 17A. Furthermore, the source potentials of the MOSFETs 17A and 17B are fixed to a potential VLOW lower than a ground potential GND.

The ground potential GND is input to an inverted input terminal of the operational amplifier 18, and a potential of a node 34 is kept at the ground potential GND by a feedback loop constituted by the operational amplifier 18 and the MOSFET 17A.

As the MOSFET 12 for detecting a leakage current, an element having the same characteristics as those in the element used in the controlled circuit 5 is used.

The drain current of the MOSFET 11A is equal to a sum of a subthreshold leakage current 60, an inter-drain-substrate current 62, and an inter-drain-gate current 61 of the MOSFET 12. On the other hand, the drain current of the MOSFET 17A is equal to a sum of the subthreshold leakage current 60, the inter-drain-gate current 61, and an inter-gate-substrate current 63 of the MOSFET 12. Furthermore, the drain current of the MOSFET 11A is subjected to mirroring for the MOSFET 11B, and a current which is twice the drain current of the MOSFET 17A is subjected to mirroring for the MOSFET 17B.

In this case, when the gate leakage currents 62 and 63 are sufficiently smaller than the subthreshold leakage current and the substrate current and can be neglected, if the substrate leakage current 62 is smaller than the subthreshold leakage current 60, a potential of the node 34 approximates to a low level, and an output 16 from a leakage detecting circuit goes to a high level. In contrast to this, when the substrate leakage current 62 is larger than the subthreshold leakage current 60, the potential of the node 34 approximates to a high level, and the output 16 from the leakage detecting circuit goes to a low level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

Since the source potential of the MOSFET 12 used for detecting leakage in the example is fixed to the ground potential GND, the inter-source-drain voltage of the MOSFET 12 is close to the power supply voltage, and effectively reflects leakage characteristics of the MOSFET constituting an actual logical circuit or the like in an OFF state.

In the circuit configuration, an operational amplifier is not used, so that a current consumption can be considerably reduced.

Furthermore, in the example, since the subthreshold leakage current and the substrate leakage current are detected from the same leakage detecting MOSFET, a detection error caused by a fluctuation in characteristic of leakage detecting MOSFETs can be eliminated.

The example is based on the assumption that the leakage current is minimum at a substrate bias at which the substrate leakage current is equal to the subthreshold leakage current. However, for example, when such element characteristics that the leakage current is minimum when the subthreshold leakage current is n times the subthreshold leakage current are used, the gate width of the MOSFET 17B is made (n+1) times the gate width of the MOSFET 17A to make it possible to control the substrate bias such that the leakage current is minimum.

In the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Eleventh Example

An entire circuit configuration of an eleventh example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 27:
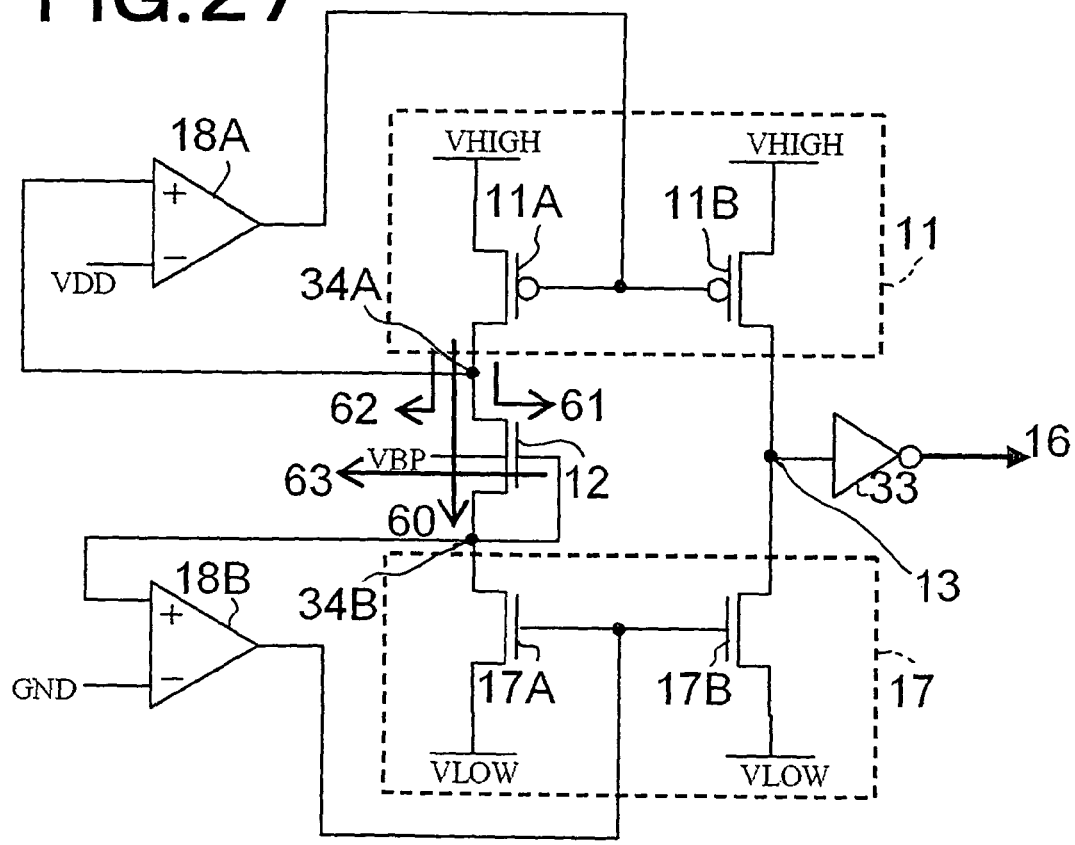
FIG. 27 is a circuit diagram showing a leakage detecting circuit in an eleventh example of the present invention.

FIG. 27 shows the configuration of a leakage detecting circuit according to the example. The leakage detecting circuit is constituted by current mirror circuits 11 and 17, operational amplifiers 18A and 18B, a leakage detecting MOSFET 12, and an inverter 33.

The MOSFETs 11A and 11B constituting the current mirror circuit 11 are p-type MOSFETs having equal element sizes. Source potentials of the MOSFETs 11A and 11B are fixed to a potential VHIGH higher than a power supply voltage VDD. MOSFETs 17A and 17B constituting the current mirror circuit 17 are n-type MOSFETs having equal element sizes. A gate width of the MOSFET 17B is twice a gate width of the MOSFET 17A. Furthermore, the source potentials of the MOSFETs 17A and 17B are fixed to a potential VLOW lower than a ground potential GND.

The power supply voltage VDD is input to an inverted input terminal of the operational amplifier 18A. A potential of a node 34A is kept at the power supply voltage VDD by a feedback loop constituted by the operational amplifier 18A and the MOSFET 11A. The ground potential GND is input to an inverted input terminal of the operational amplifier 18B, and a potential of a node 34B is kept at the ground potential GND by a feedback loop constituted by the operational amplifier 18B and the MOSFET 17A.

As the MOSFET 12 for detecting a leakage current, an element having the same characteristics as those in the element used in the controlled circuit 5 is used.

The drain current of the MOSFET 11A is equal to a sum of a subthreshold leakage current 60, an inter-drain-substrate current 62, and an inter-drain-gate current 61 of the MOSFET 12. On the other hand, the drain current of the MOSFET 17A is equal to a sum of the subthreshold leakage current 60, the inter-drain-gate current 61, and an inter-gate-substrate current 63 of the MOSFET 12. Furthermore, the drain current of the MOSFET 11A is subjected to mirroring for the MOSFET 11B, and a current which is twice the drain current of the MOSFET 17A is subjected to mirroring for the MOSFET 17B.

In this case, when the gate leakage currents 62 and 63 are sufficiently smaller than the subthreshold leakage current and the substrate current and can be neglected, if the substrate leakage current 62 is smaller than the subthreshold leakage current 60, a potential of the node 13 approximates to a low level, and an output 16 from a detecting circuit goes to a high level. In contrast to this, when the substrate leakage current 62 is larger than the subthreshold leakage current 60, the potential of the node 13 approximates to a high level, and the output 16 from the detecting circuit goes to a low level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

Since the drain potential of the MOSFET 12 used for detecting leakage in the example is fixed to the power supply voltage VDD, and the source potential is fixed to the ground potential GND. For this reason, an inter-source-drain voltage of the MOSFET 12 is equal to the power supply voltage, and effectively reflects leakage characteristics of the MOSFET constituting an actual logical circuit or the like in an OFF state.

In the circuit configuration, an operational amplifier is not used, so that a current consumption can be considerably reduced.

Furthermore, in the example, since the subthreshold leakage current and the substrate leakage current are detected from the same leakage detecting MOSFET, a detection error caused by a fluctuation in characteristic of leakage detecting MOSFETs can be eliminated.

The example is based on the assumption that the leakage current is minimum at a substrate bias at which the substrate leakage current is equal to the subthreshold leakage current. However, for example, when such element characteristics that the leakage current is minimum when the substrate leakage current is n times the subthreshold leakage current are used, the gate width of the MOSFET 17B is made (n+1) times the gate width of the MOSFET 17A to make it possible to control the substrate bias such that the leakage current is minimum.

In the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Figure 28:
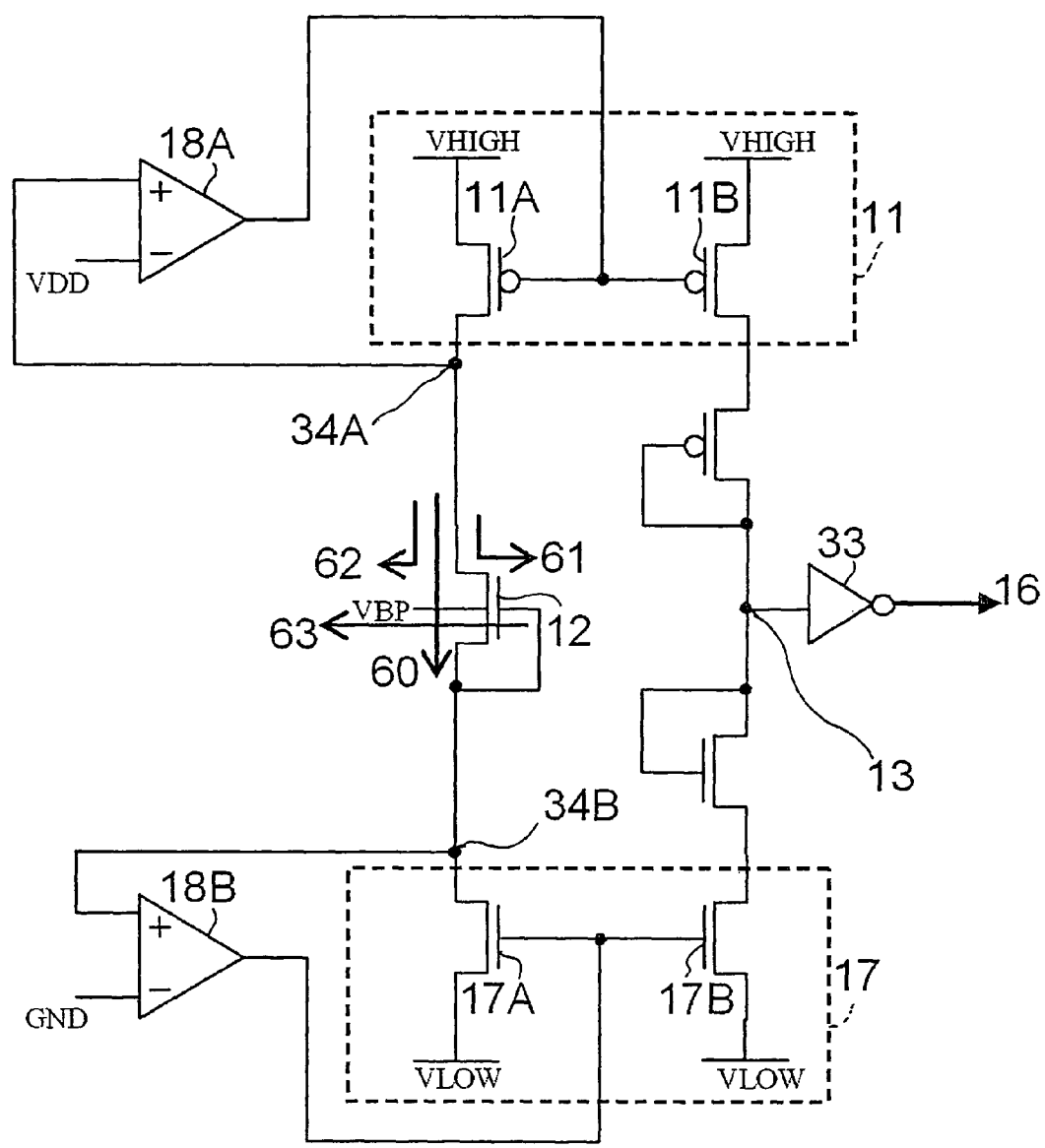
FIG. 28 is a circuit diagram showing the leakage detecting circuit in the eleventh example of the present invention.

In the example, the potential of the node 13 changes from VLOW to VHIGH depending on an operation state of the circuit. When a withstand voltage of an element is posed as a problem, as shown in FIG. 28, an arbitrary number of p-type MOSFETs or n-type MOSFETs are inserted in series between the MOSFET 11B and the MOSFET 17B to make it possible to reduce a change in potential of the node 13. In this case, the advantages of the present invention are not deteriorated.

Figure 29:
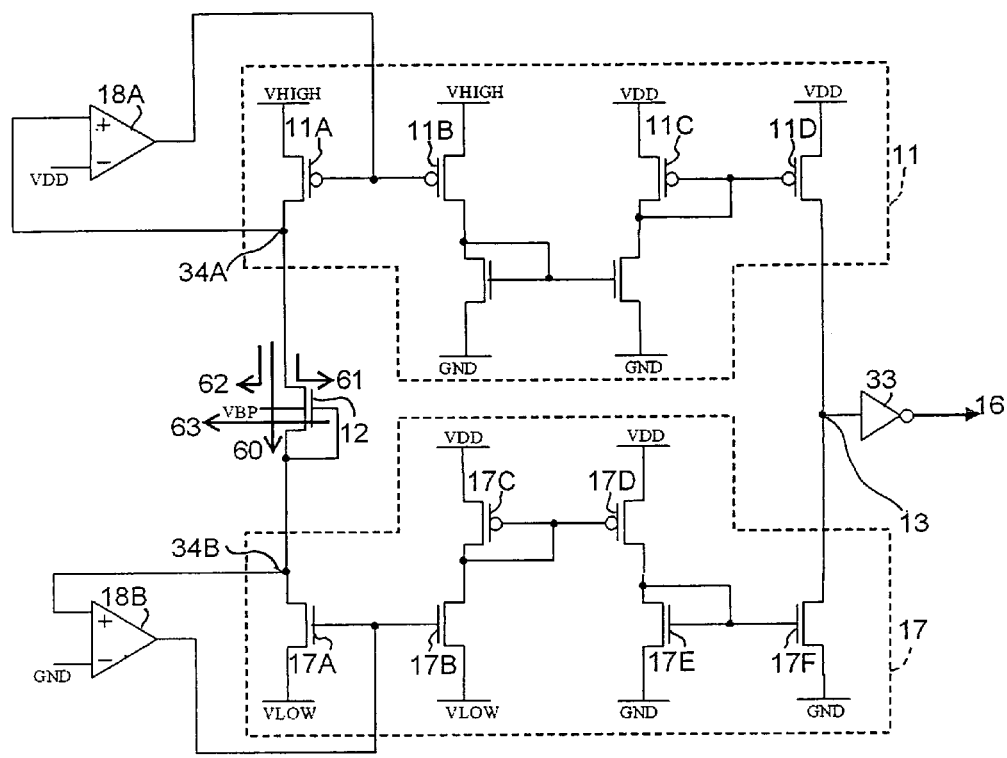
FIG. 29 is a circuit diagram showing the leakage detecting circuit in the eleventh example of the present invention.

Furthermore, as shown in FIG. 29, the configurations of the current mirror circuits 11 and 17 are changed, the source potentials of the MOSFETs 11A and 11B are fixed to the VHIGH, the source potentials of MOSFETs 11C and 11D are fixed to a power supply voltage, the source potentials of the MOSFETs 17A and 17B are fixed to the VLOW, the source potentials of MOSFETs 17E and 17F are fixed to the ground potential GND, so that the change in potential of the node 13 can be made lower than the power supply voltage. Even in this case, the advantages of the present invention are not deteriorated.

Twelfth Example

An entire circuit configuration of a twelfth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 30:
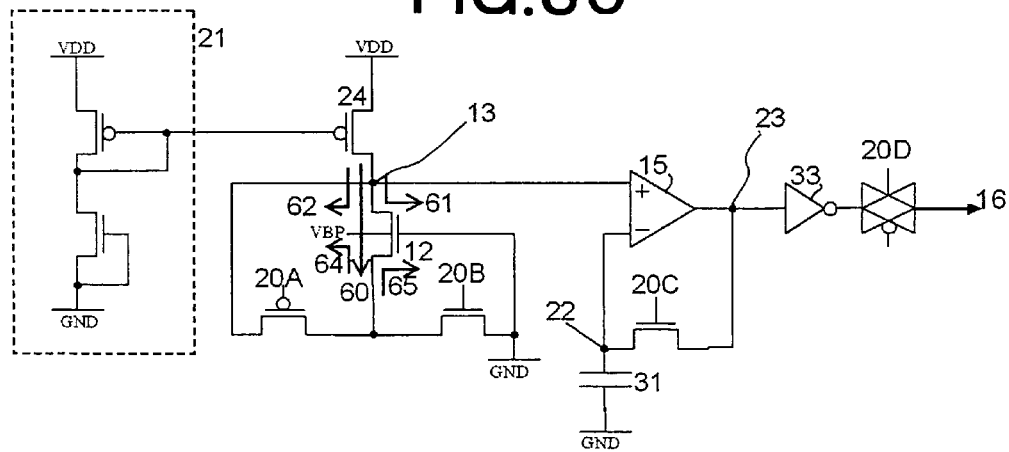
FIG. 30 is a circuit diagram showing a leakage detecting circuit in a twelfth example of the present invention.

FIG. 30 shows the configuration of a leakage detecting circuit according to the example. The leakage detecting circuit is constituted by a gate bias generating unit 21, a p-type MOSFET 24, an operational amplifier 15, a capacitor 31, a leakage detecting MOSFET 12, an inverter 33, a p-type MOSFET 20A, n-type MOSFETs 20B and 20C, and a transmission gate 20D.

As the MOSFET 12 for detecting a leakage current, an element having the same characteristics as those in the element used in the controlled circuit 5 is used. The drain area and the source area of the leakage detecting MOSFET 12 are made equal to each other.

The gate bias generating unit 21 generates such a potential that a potential of a node 13 is lower than a power supply voltage by a threshold voltage value of the MOSFET 24 to input the potential to the gate of the MOSFET 24.

Figure 31:
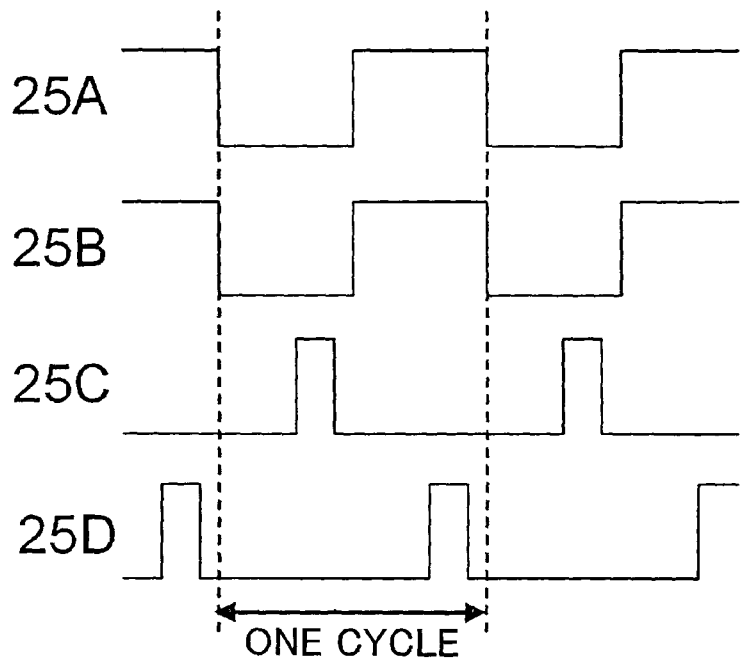
FIG. 31 is a timing chart showing timings of control clocks in the twelfth example of the present invention.

Different clock signals 25A, 25B, 25C, and 25D are input to the MOSFETs 20A, 20B, 20C, and 20D, respectively. Timing charts of the clocks are shown in FIG. 31.

An operation of the leakage detecting circuit will be described below with reference to the timing charts in FIG. 31.

The clock signals 25A and 25B go to a low level, and the source and the drain of the leakage detecting MOSFET 12 are connected to each other. At this time, a drain current of the p-type MOSFET 24 is equal to a sum of an inter-drain-substrate current 62, an inter-source-substrate current 64, an inter-drain-gate current 61, and an inter-source-gate current 65 of the leakage detecting MOSFET 12. However, since the drain area and the source area of the leakage detecting MOSFET 12 are equal to each other, the inter-drain-substrate current 62 is equal to the inter-source-substrate current 64.

The clock signal 25C goes to a high level, and the potentials of the node 13 and nodes 22 and 23 are equal to each other.

The clock signal 25C goes to a low level, and the node 22 is disconnected from another node and kept at the same potential.

The clock signals 25A and 25B go to high level, the source of the MOSFET 12 is grounded. At this time, the drain current of the MOSFET 24 is equal to a sum of the inter-drain-substrate current 62, the inter-drain-gate current 61, and the subthreshold leakage current 60 of the MOSFET 12.

In this case, when the inter-source-gate current 65 is sufficiently smaller than the subthreshold leakage current 60 and the substrate leakage current and can be neglected, if the drain current of the MOSFET 24 obtained when the source of the MOSFET 12 is grounded is larger than the drain current of the MOSFET 24, i.e., the subthreshold leakage current 60 is larger than the substrate leakage current 62, the potential of the node 13 is lower than the potential of the node 22, and the potential of the node 23 goes to a low level. In contrast to this, when the subthreshold leakage current 60 is smaller than the substrate leakage current 62, the potential of the node 13 becomes higher than the potential of the node 22, and the potential of the node 23 goes to a high level.

When the clock signal 25D goes to a high level, an output 16 is changed to a high level when the potential of the node 23 is at a low level, and the output 16 is changed to a low level when the potential of the node 23 is at a high level. Thereafter, the clock signal 25D returns to the low level.

The operation performed up to now is defined as one cycle. The same operation will be repeated subsequently.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum. Furthermore, in the circuit configuration, since the subthreshold leakage current and the substrate leakage current are detected from the same leakage detecting MOSFET, a detection error caused by a fluctuation in characteristic of leakage detecting MOSFETs can be eliminated.

The capacitor 31 is used to hold the potential of the node 22 in the example. However, the capacitor may not be used when a fluctuation in potential of the node 22 is sufficiently small because the clock cycle is sufficiently short or leakage to another node is sufficiently small.

In the example, the p-type MOSFET is used as the element 20A, the n-type MOSFETs are used as the elements 20B and 20C, and the transmission gate is used as the element 20D. However, any elements which can be completely turned on or off depending on clock inputs described in the example may be used in place of the p-type MOSFET, the n-type MOSFET, the transmission gate, and the like. In contrast to this, if switches can be turned on or off at the timing described in the example, the elements and the clock inputs may be changed.

Thirteenth Example

An entire circuit configuration of a thirteenth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 32:
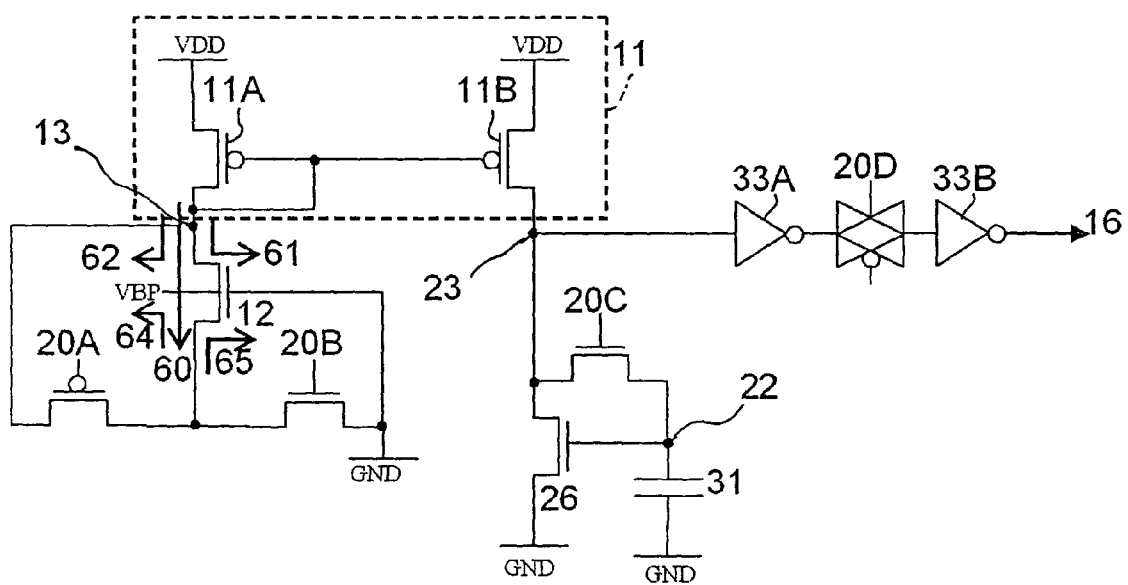
FIG. 32 is a circuit diagram showing a leakage detecting circuit in a thirteenth example of the present invention.

FIG. 32 shows the configuration of a leakage detecting circuit according to the example. The leakage detecting circuit is constituted by MOSFETs 11A and 11B constituting a current mirror circuit 11, an n-type MOSFET 26, a capacitor 31, a p-type MOSFET 20A, n-type MOSFETs 20B and 20C, a transmission gate 20D, inverters 33A and 33B, and a leakage detecting MOSFET 12.

The MOSFETs 11A and 11B constituting the current mirror circuit 11 are p-type MOSFETs having equal element sizes.

As the MOSFET 12 for detecting a leakage current, an element having the same characteristics as those in the element used in the controlled circuit 5 is used. The drain area and the source area of the MOSFET 12 are made equal to each other.

Figure 33:
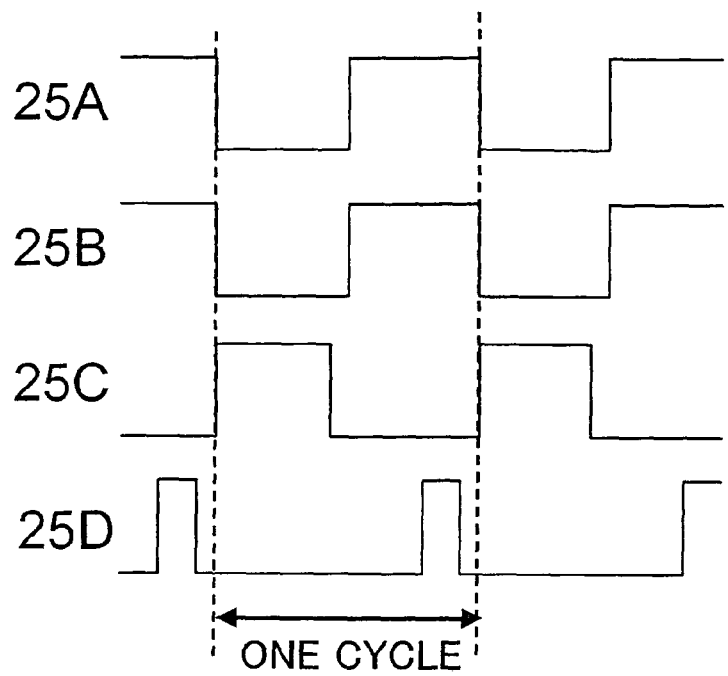
FIG. 33 is a timing chart showing timings of control clocks in the thirteenth example of the present invention.

Different clock signals 25A, 25B, 25C, and 25D are input to the MOSFETs 20A, 20B, 20C, and 20D, respectively. Timing charts of the clocks are shown in FIG. 33.

An operation of the leakage detecting circuit will be described below with reference to the timing charts in FIG. 33.

The clock signals 25A and 25B go to a low level, and the source and the drain of the MOSFET 12 are connected to each other. At this time, a drain current of the MOSFET 11A is equal to a sum of an inter-drain-substrate current 62, an inter-source-substrate current 64, an inter-drain-gate current 61, and an inter-source-gate current 65 of the MOSFET 12. However, since the drain area and the source area of the MOSFET 12 are equal to each other, the inter-source-substrate current 64 and the inter-drain-substrate current 62 are equal to each other. Furthermore, the drain current of the MOSFET 11A is subjected to mirroring through the current mirror circuit 11, and a drain current of the MOSFET 26 becomes equal to the drain current of the MOSFET 11A.

The clock signal 25C goes to a low level, and the drain and the gate of the MOSFET 26 are disconnected from each other to hold the gate potential of the MOSFET 26.

The clock signals 25A and 25B go to high level, the source of the MOSFET 12 is grounded. At this time, the drain current of the MOSFET 11A is equal to a sum of the inter-drain-substrate current 62, the inter-drain-gate current 61, and the subthreshold leakage current 60 of the MOSFET 12. The drain current of the MOSFET 11A is subjected to mirroring for the MOSFET 11B through the current mirror circuit 11.

In this case, when the inter-source-gate current 65 is sufficiently smaller than the subthreshold leakage current 60 and the substrate leakage current 62 and can be neglected, if the drain current of the MOSFET 11A obtained when the source of the MOSFET 12 is grounded is larger than the drain current of the MOSFET 11A, i.e., the subthreshold leakage current 60 is larger than the substrate leakage current 62, the potential of a node 14 approximates to a high level.

In contrast to this, when the subthreshold leakage current 60 is smaller than the inter-drain-substrate current 62, the potential of the node 14 approximates to a low level.

When the clock signal 25D goes to a high level, an output 16 is changed to a high level when the potential of the node 23 is at a high level, and the output 16 is changed to a low level when the potential of the node 23 is at a low level. Thereafter, the clock signal 25D returns to the low level.

The operation performed up to now is defined as one cycle. The same operation will be repeated subsequently.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum. Furthermore, in the circuit configuration, since leakage current components for comparison are detected from the same leakage detecting MOSFET, a detection error caused by a fluctuation in characteristic of leakage detecting MOSFETs can be eliminated.

The capacitor 31 is used to hold the gate potential of the MOSFET 26 in the example. However, the capacitor may not be used when a fluctuation in potential of the node 22 is sufficiently small because the clock cycle is sufficiently short or leakage to another node is sufficiently small.

In the example, the p-type MOSFET is used as the element 20A, the n-type MOSFETs are used as the elements 20B and 20C, and the transmission gate is used as the element 20D. However, any elements which can be completely turned on or off depending on clock inputs described in the example may be used in place of the p-type MOSFET, the n-type MOSFET, the transmission gate, and the like. In contrast to this, if switches can be turned on or off at the timing described in the example, the elements and the clock inputs may be changed.

Fourteenth Example

An entire circuit configuration of a fourteenth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 34:
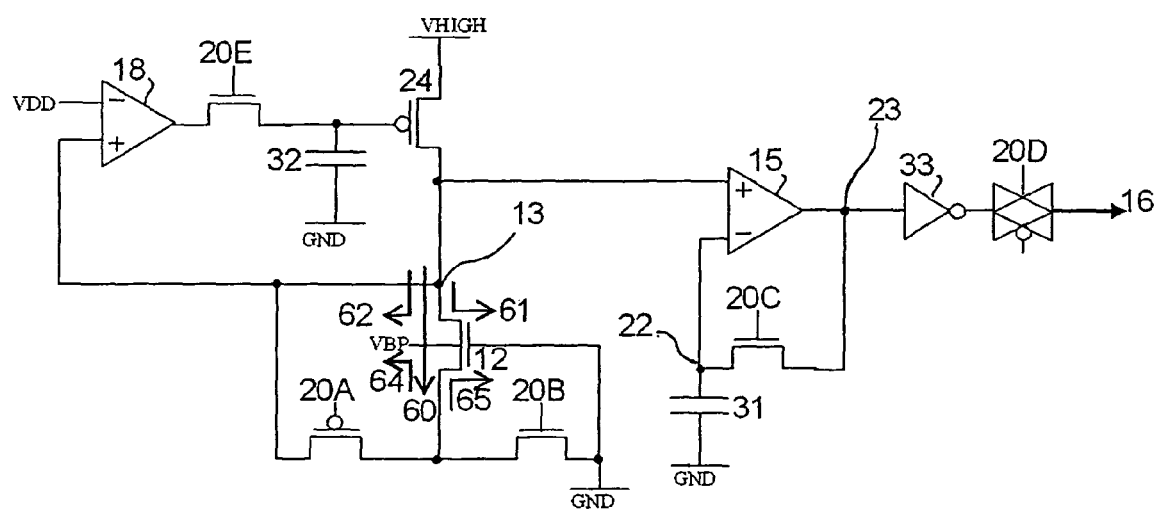
FIG. 34 is a circuit diagram showing a leakage detecting circuit in a fourteenth example of the present invention.

FIG. 34 shows the configuration of a leakage detecting circuit according to the example. The leakage detecting circuit is constituted by a p-type MOSFET 24, operational amplifiers 18 and 15, capacitors 31 and 32, an inverter 33, a leakage detecting MOSFET 12, p-type MOSFET 20A, n-type MOSFETs 20B, 20C, and 20E, and a transmission gate 20D.

As the MOSFET 12 for detecting a leakage current, an element having the same characteristics as those in the element used in the controlled circuit 5 is used. The drain area and the source area of the MOSFET 12 are made equal to each other.

The source potential of the p-type MOSFET 24 is fixed to the potential VHIGH higher than the power supply voltage VDD.

The power supply voltage VDD is input to an inverted input terminal of the operational amplifier 18.

Different clock signals 25A, 25B, 25C, 25D, and 25E are input to the MOSFETs 20A, 20B, 20C, 20D, and 20E respectively. Timing charts of the clocks are shown in FIG. 35.

An operation of the leakage detecting circuit will be described below with reference to the timing charts in FIG. 35.

The clock signals 25A and 25B go to a low level, the clock signal 25E goes to a high level, and the source and the drain of the MOSFET 12 are connected to each other. At this time, a node 13 is fixed to the power supply voltage VDD by a feedback loop constituted by the operational amplifier 18, the MOSFET 20E, and the MOSFET 24. At this time, the drain current of the MOSFET 24 is equal to a sum of an inter-drain-substrate current 62, an inter-source-substrate current 64, an inter-drain-gate current 61, and an inter-source-gate current 65 of the MOSFET 12. Since a drain area and a source area of the MOSFET 12 are equal to each other, the inter-drain-substrate current 62 is equal to the inter-source-substrate current 64.

The clock signal 25C goes to a high level, and the potential of the node 13 and the potentials of nodes 22 and 23 are equal to each other.

The clock signal 25C goes to a low level, and the node 22 is disconnected from another node and kept at the same potential.

The clock signal 25E goes to a low level, and the gate of the MOSFET 24 is disconnected from another gate and kept at the same potential.

Next the clock signals 25A, 25B go to a high level, and a source of the MOSFET 12 is grounded. At this time, the drain current of the MOSFET 24 is equal to s sum of the inter-drain-substrate current 62, the inter-drain-gate-current 61 and the subthreshold leakage current 60.

In this case, when the inter-source-gate current 65 is sufficiently smaller than the subthreshold leakage current 60 and the substrate leakage current 62 and can be neglected, if the drain current of the MOSFET 24 obtained when the source of the MOSFET 12 is grounded is larger than the drain current of the MOSFET 24 obtained when the source and the drain of the MOSFET 12 are connected to each other, i.e., the subthreshold leakage current 60 is larger than the inter-drain-substrate current 62, the potential of the node 13 becomes higher than the potential of the node 22, and the potential of the node 23 goes to a high level.

When the clock signal 25D goes to a high level, and when the potential of the node 23 is at a low level, an output 16 from an output unit 31 is changed to a high level. When the potential of the node 23 is at a high level, the output 16 is changed to a low level. Thereafter, the clock signal 25D returns to the low level.

The operation performed up to now is defined as one cycle. The same operation will be repeated subsequently.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum. Furthermore, in the circuit configuration, since the subthreshold leakage current and the substrate leakage current are detected from the same leakage detecting MOSFET, a detection error caused by a fluctuation in characteristic of leakage detecting MOSFETs can be eliminated.

The capacitor 31 is used to hold the potential of the node 22 in the example. However, the capacitor 31 may not be used when a fluctuation in potential of the node 22 is sufficiently small because the clock cycle is sufficiently short or leakage to another node is sufficiently small.

The capacitor 32 is used to hold the gate potential of the MOSFET 24. However, the capacitor 32 may not be used when a fluctuation in potential of the node 24 is sufficiently small because the clock cycle is sufficiently short or leakage to another node is sufficiently small.

Since the inter-source-drain voltage of the MOSFET used in leakage detection in the example is equal to the power supply voltage, the inter-source-drain voltage can very effectively reflect leakage characteristics of the MOSFET constituting an actual logical circuit or the like in an OFF state.

Clock signals shown in FIG. 36 may be input to the MOSFETs 20A, 20B, 20C, 20D, and 20E. In this case, the substrate bias generating circuit operates in a direction to make the substrate bias deep when an output from the detecting circuit is at a low level, and the substrate bias generating circuit is stopped when the output is at a high level, so that the advantages of the present invention are obtained.

In the example, the p-type MOSFET is used as the element 20A, the n-type MOSFETs are used as the elements 20B, 20C, and 20E, and the transmission gate is used as the element 20D. However, any elements which can be completely turned on or off depending on clock inputs described in the example may be used in place of the p-type MOSFET, the n-type MOSFET, the transmission gate, and the like. In contrast to this, if switches can be turned on or off at the timing described in the example, the elements and the clock inputs may be changed.

Fifteenth Example

An entire circuit configuration of a fifteenth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 37:
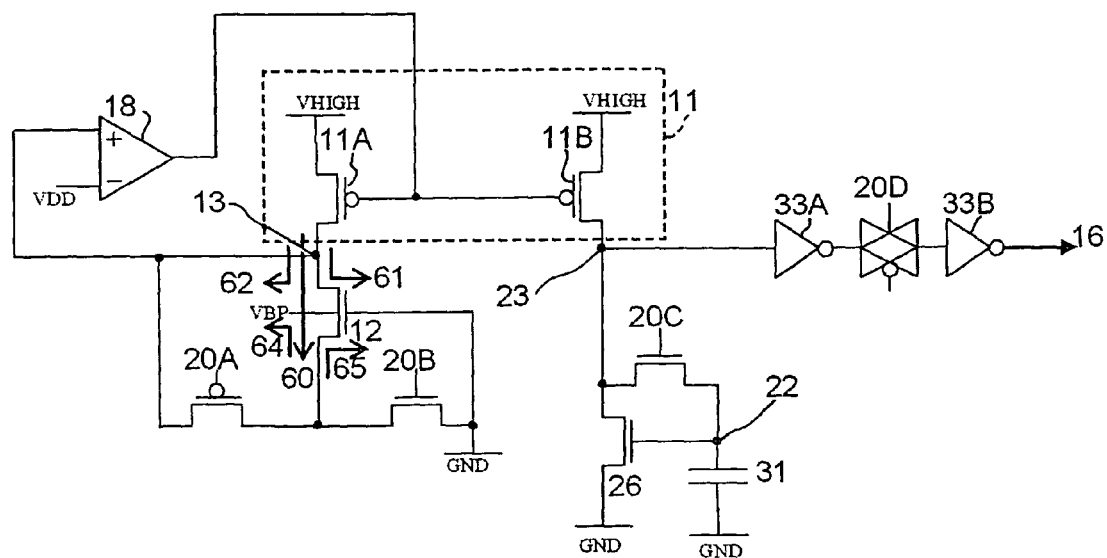
FIG. 37 is a circuit diagram showing a leakage detecting circuit in a fifteenth example of the present invention.

FIG. 37 shows the configuration of a leakage detecting circuit according to the example. The leakage detecting circuit is constituted by MOSFETs 11A and 11B constituting a current mirror circuit 11, an operational amplifier 18, an n-type MOSFET 26, a capacitor 31, inverters 33A and 33B, a leakage detecting MOSFET 12, a p-type MOSFET 20A, n-type MOSFETs 20B and 20C, and a transmission gate 20D.

As the MOSFET 12 for detecting a leakage current, an element having the same characteristics as those in the element used in the controlled circuit 5 is used. The drain area and the source area of the MOSFET 12 are made equal to each other.

The MOSFETs 11A and 11B constituting the current mirror circuit 11 are p-type MOSFETs having equal element sizes. Source potentials of the MOSFETs 11A and 11B are fixed to a potential VHIGH higher than a power supply voltage.

The power supply voltage VDD is input to an inverted input terminal of the operational amplifier 18A. A potential of a node 13 is always fixed to the power supply voltage VDD by a feedback loop constituted by the operational amplifier 18A and the MOSFET 11A.

Figure 38:
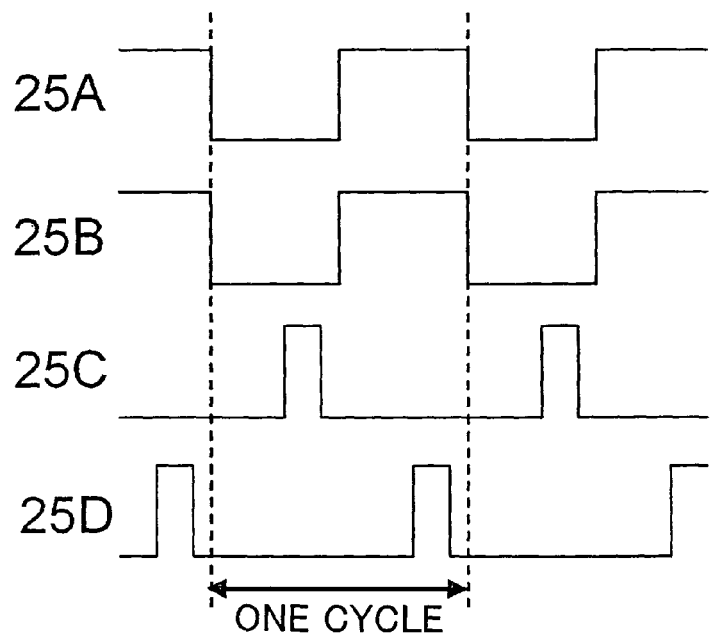
FIG. 38 is a timing chart showing timings of control clocks in the fifteenth example of the present invention.

Different clock signals 25A, 25B, 25C, and 25D are input to the MOSFETs 20A, 20B, 20C, and 20D respectively. Timing charts of the clocks are shown in FIG. 38.

An operation of the leakage detecting circuit will be described below with reference to the timing charts in FIG. 38.

The clock signals 25A and 25B go to a low level, and the source and the drain of the MOSFET 12 are connected to each other. At this time, the drain current of the MOSFET 11a is equal to a sum of an inter-drain-substrate current 62, an inter-source-substrate current 64, an inter-drain-gate current 61, and an inter-source-gate current 65 of the MOSFET 12. The current mirror circuit 11 makes the drain current of the MOSFET 26 equal to the drain current of the MOSFET 11A.

The clock signal 25C goes to a high level, and the potentials of the nodes 22 and 23 are equal to each other.

The clock signal 25C goes to a low level, and the node 22 is disconnected from another node and kept at the same potential.

The clock signals 25A and 25B go to a high level, and the source of the MOSFET 12 is grounded. At this time, the drain current of the MOSFET 11A is equal to a sum of the inter-drain-substrate current 62, the gate leakage current, and the subthreshold leakage current of the MOSFET 12. A current equal to the drain current of the MOSFET 12 flows in the MOSFET 11B.

In this case, when the inter-source-gate current 65 is sufficiently smaller than the subthreshold leakage current 60 and the substrate leakage current 62 and can be neglected, if the drain current obtained when the source of the MOSFET 12 is grounded is larger than the drain current obtained when the source and the drain are connected to each other, i.e., the subthreshold leakage current 60 is larger than the inter-drainsubstrate current 62, the potential of the node 23 approximates to a high level. In contrast to this, when the subthreshold leakage current 60 is smaller than the inter-drain-substrate current 62, the potential of the node 23 approximates to a low level.

When the clock signal 25D goes to a high level, and when the potential of the node 23 is at a low level, an output 16 is changed to a low level. When the potential of the node 23 is at a high level, the output 16 is changed to a high level. Thereafter, the clock signal 25D returns to the low level.

The operation performed up to now is defined as one cycle. The same operation will be repeated subsequently.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum. Furthermore, in the circuit configuration, since the subthreshold leakage current and the substrate leakage current are detected from the same leakage detecting MOSFET, a detection error caused by a fluctuation in characteristic of leakage detecting MOSFETs can be eliminated.

The capacitor 31 is used to hold the potential of the node 22 in the example. However, the capacitor 31 may not be used when a fluctuation in potential of the node 22 is sufficiently small because the clock cycle is sufficiently short or leakage to another node is sufficiently small.

Since the inter-source-drain voltage of the MOSFET used in leakage detection in the example is equal to the power supply voltage, the inter-source-drain voltage can very effectively reflect leakage characteristics of the MOSFET constituting an actual logical circuit or the like in an OFF state.

In the example, the p-type MOSFET is used as the element 20A, the n-type MOSFETs are used as the elements 20B and 20C, and the transmission gate is used as the element 20D. However, any elements which can be completely turned on or off depending on clock inputs described in the example may be used in place of the p-type MOSFET, the n-type MOSFET, the transmission gate, and the like. In contrast to this, if switches can be turned on or off at the timing described in the example, the elements and the clock inputs may be changed.

Sixteenth Example

An entire circuit configuration of a sixteenth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 39:
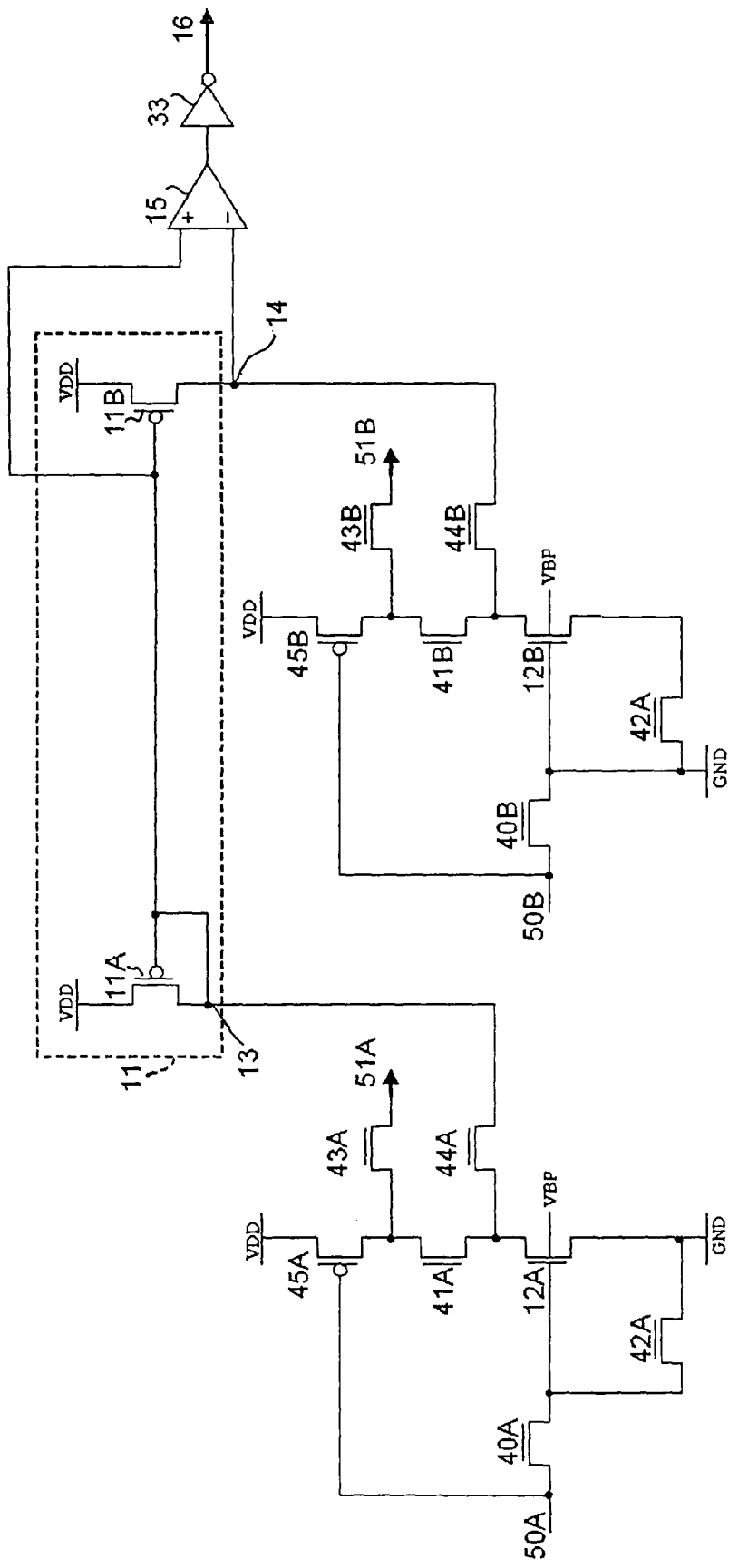
FIG. 39 is a timing chart showing timings of control clocks in a sixteenth example of the present invention.

FIG. 39 shows the configuration of a leakage detecting circuit according to the example. The leakage detecting circuit is constituted by MOSFETs 11A and 11B constituting a current mirror circuit 11, a leakage detecting MOSFET 12A, a leakage detecting MOSFET 12B, an operational amplifier 15, an MOSFET 26, an inverter 33, p-type MOSFETs 45A, 45B and MOSFET switches 40A, 41A, 42A, 43A, 44A, 40B, 41B, 42B, 43B, and 44B.

The leakage detecting circuit in the example has two operation states, i.e., a detection mode and an energization mode.

In the detection mode, the MOSFET switches 40A, 41A, 43A, 40B, 41B, and 43B are turned on, and the MOSFET switches 42A, 44A, 42B, and 44B are turned off. At this time, the leakage detecting circuit in the example has a circuit configuration equivalent to that of the leakage detecting circuit in the first example, and a circuit operation thereof follows the circuit operation in the first example.

In the energization mode, the MOSFET switches 40A, 41A, 43A, 40B, 41B, and 43B are turned off, and the MOSFET switches 42A, 44A, 42B, and 44B are turned on. At this time, the MOSFET 12A is paired with a MOSFET 45A and functions as a part of an inverter having an input 50A and an output 51A. The MOSFET 12B is pared with the MOSFET 45B and functions as a part of an inverter having an input 50B and an output 51B.

In this manner, by using the semiconductor integrated circuit device according to the example, since an ON current can be caused to flow in a leakage detecting MOSFET in the energization mode, a change in characteristic caused by deterioration of an element can be reproduced to make it possible to reduce a detection error of a leakage current when a substrate bias is controlled in the detection mode.

The leakage detecting MOSFET is operated as a part of the inverter in the energization mode. However, the leakage detecting MOSFET may be operated as a constituent element of another arbitrary circuit. Alternatively, only an ON current may be caused to flow in the leakage detecting MOSFET without giving a specific function to the MOSFET.

The n-type MOSFET is used as a switch for switching connections in the circuit in the example. However, an element such as a p-type MOSFET or a transmission gate which can be completely turned on or off depending on the operation modes may be used.

As the circuit configuration in the detection mode, a circuit configuration which is different from that in the first example and which can detect a subthreshold leakage current and a substrate leakage current and compare the currents with each other may be used.

Seventeenth Example

An entire circuit configuration of a seventeenth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 40:
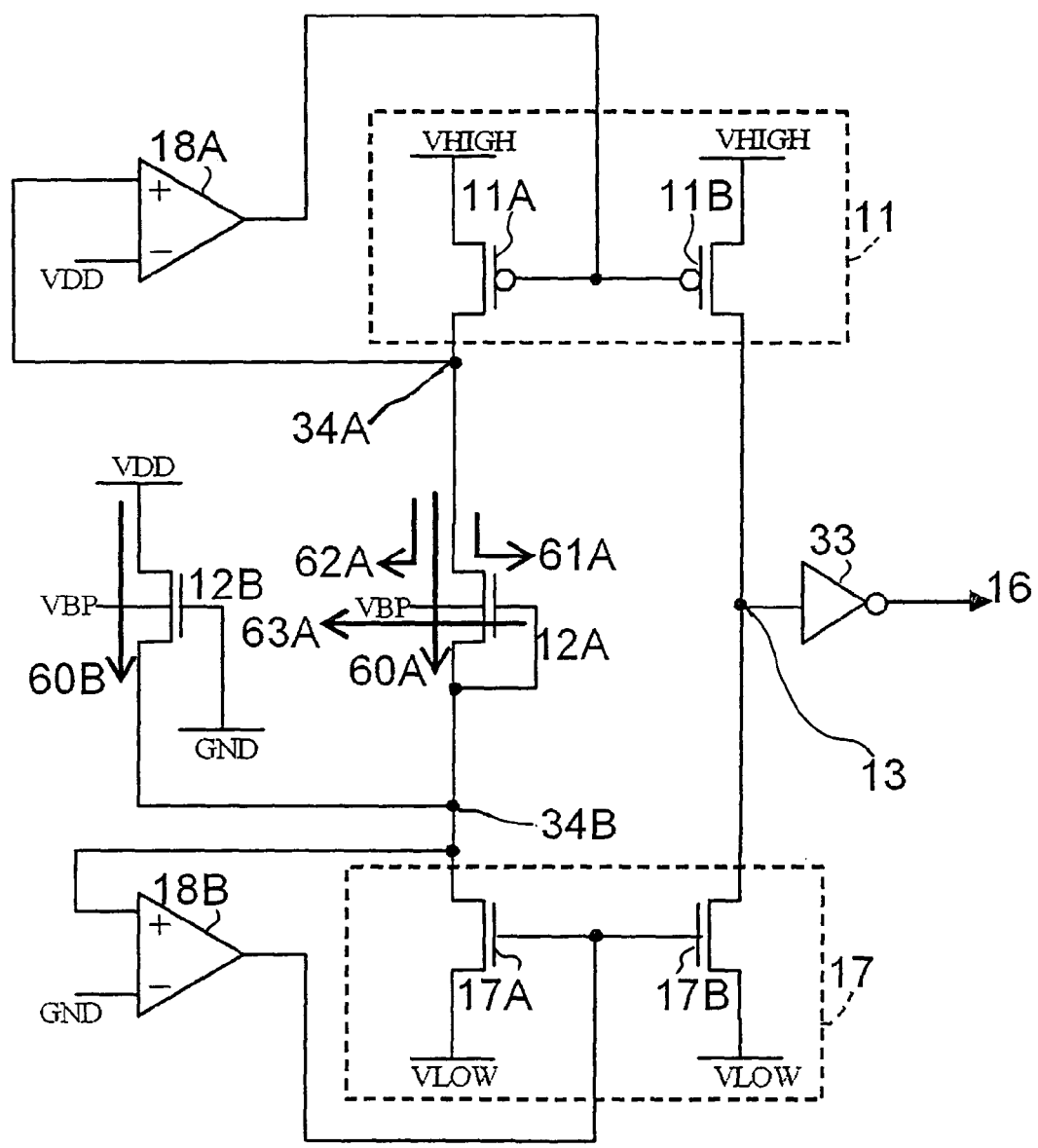
FIG. 40 is a circuit diagram showing a leakage detecting circuit in a seventeenth example of the present invention.

FIG. 40 shows the configuration of a leakage detecting circuit according to the example. The leakage detecting circuit is constituted by current mirror circuits 11 and 17, operational amplifiers 18A and 18B, leakage detecting MOSFETs 12A and 12B, and an inverter 33.

The MOSFETs 11A and 11B constituting the current mirror circuit 11 are p-type MOSFETs having equal element sizes. Source potentials of the MOSFETs 11A and 11B are fixed to a potential VHIGH higher than a power supply voltage VDD. MOSFETs 17A and 17B constituting the current mirror circuit 17 are n-type MOSFETs having equal element sizes. Source potentials of MOSFETs 17A and 17B are fixed to a potential VLO which is lower than the ground potential GND. The power supply voltage VDD is input to an inverted input terminal of the operational amplifier 18A, and a potential of a node 34A is always fixed to the power supply voltage VDD by a feedback loop constituted by the operational amplifier 18A and the MOSFET 11A. Further, the ground potential GND is input to an inverted input terminal of the operational amplifier 18B, and a potential of a node 34B is always fixed to the ground potential GND by a feedback loop constituted by the operational amplifier 18B and the MOSFET 17A.

As the MOSFETs 12A and 12B for detecting a leakage current, element having the same characteristics as those of an element used in the controlled circuit 5, and the MOSFET 12A and the MOSFET 12B are made equal to each other in size.

A current flowing in a node 34A is equal to a sum of a subthreshold leakage current, a substrate leakage current, and a gate leakage current of the MOSFET 12A. On the other hand, a current flowing in the node 34B is equal to a sum of the subthreshold leakage current a gate leakage current of the MOSFET 12A and a subthreshold leakage current of the MOSFET 12B. A current flowing in the node 34A is subjected to mirroring for the MOSFET 11B through the current mirror circuit 11, and a current which is twice a current flowing in the node 34B is subjected to mirroring for the MOSFETs 17A and 17B through the current mirror circuit 17.

When the substrate leakage current is smaller than the subthreshold leakage current, a potential of a node 13 approximates to a low level, and an output 16 from the detecting circuit goes to a high level. In contrast to this, when the substrate leakage current is larger than the subthreshold leakage current of the MOSFET 12A, the potential of the node 13 approximates to a high level, and the output 16 from the detecting circuit goes to a low level.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

The drain potentials of the MOSFET 12A and the MOSFET 12B used to detect leakage in the example are fixed to the power supply voltage VDD, and the source potentials of the MOSFETs 12A and 12B are fixed to the ground potential GND. For this reason, an inter-source-drain voltage of the MOSFET 12 is equal to a power supply voltage and can very effectively reflect leakage characteristics of the MOSFET constituting an actual logical circuit or the like in an OFF state.

In the circuit configuration, an operational amplifier is not used, so that a current consumption can be considerably reduced.

The gate leakage current of the MOSFET 12A flowing in the node 34A is a current obtained by subtracting an inter-gate-substrate current from an inter-drain-gate current in the example. For this reason, finally, the potential of the node 13 changes from a high level to a low level by magnitude relation between a sum of the inter-drain-substrate current and the inter-gate-substrate current and the subthreshold leakage current. As a result, even though the inter-gate-substrate current is so large that the inter-gate-substrate current cannot be neglected, a detection error can be considerably reduced.

The example is based on the assumption that the leakage current is minimum at a substrate bias at which the substrate leakage current is equal to the subthreshold leakage current. However, for example, when such element characteristics that the leakage current is minimum when the subthreshold leakage current is n times the subthreshold leakage current are used, the gate width of the MOSFET 17B is made 0.5× (n+1) times the gate width of the MOSFET 17A to make it possible to control the substrate bias such that the leakage current is minimum. However, when a ratio of the inter-gate-substrate current to the substrate leakage current is large, a correction error of the leakage current occurs.

In the example, the substrate leakage current used when the substrate leakage current and the subthreshold leakage current are compared with each other does not include an inter-source-substrate current. However, since the inter-source-substrate current is sufficiently smaller than the inter-drain-substrate current in general, the influence of the inter-source-substrate current can be neglected.

Figure 41:
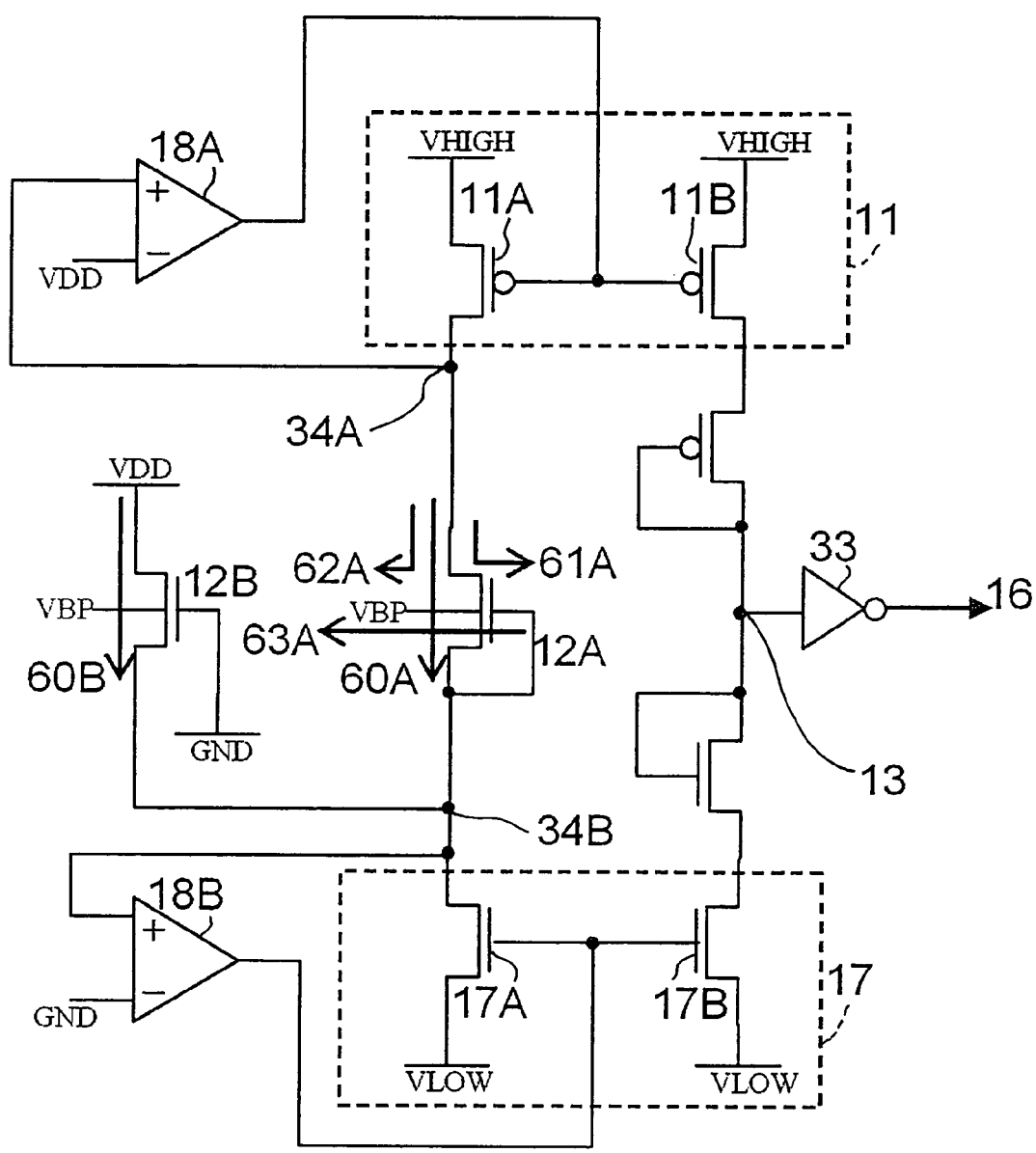
FIG. 41 is a circuit diagram showing the leakage detecting circuit in the seventeenth example of the present invention.

In the example, the potential of the node 13 changes from VLOW to VHIGH depending on an operation state of the circuit. When a withstand voltage of an element is posed as a problem, as shown in FIG. 41, an arbitrary number of p-type MOSFETs or n-type MOSFETs are inserted in series between the MOSFET 11B and the MOSFET 17B to make it possible to reduce a change in potential of the node 13. In this case, the advantages of the present invention are not deteriorated.

Figure 42:
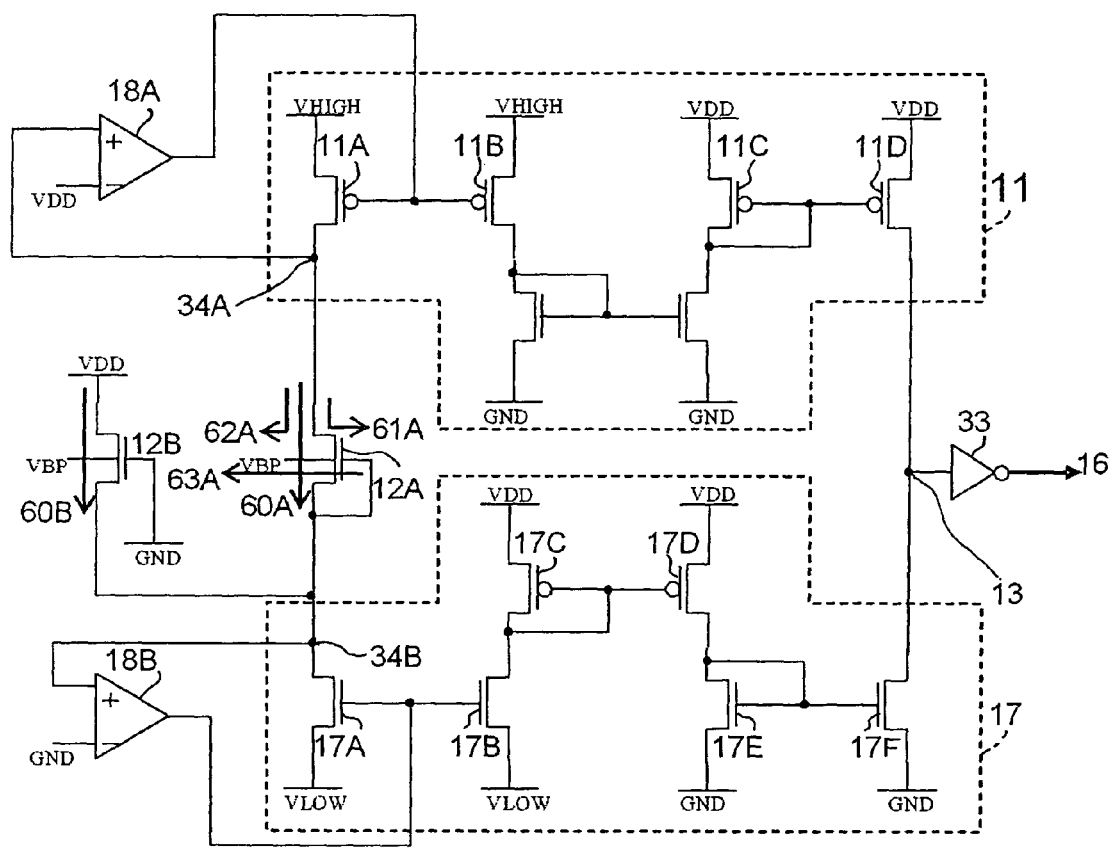
FIG. 42 is a circuit diagram showing the leakage detecting circuit in the seventeenth example of the present invention.

Furthermore, as shown in FIG. 42, the configurations of the current mirror circuits 11 and 17 are changed, the source potentials of the MOSFETs 11A and 11B are fixed to the potential VHIGH, the source potentials of MOSFETs 11C and 11D are fixed to a power supply voltage, the source potentials of the MOSFETs 17A and 17B are fixed to the potential VLOW, the source potentials of MOSFETs 17E and 17F are fixed to the ground potential GND, so that the change in potential of the node 13 can be made lower than the power supply voltage. Even in this case, the advantages of the present invention are not lost.

Eighteenth Example

An entire circuit configuration of an eighteenth example of a semiconductor integrated circuit device according to the present invention is the same as that in the first example shown in FIG. 3 except for the circuit configuration of the leakage detecting circuit 2. Therefore, only the leakage detecting circuit 2 will be described below. The following explanation is performed with respect to a case in which all leakage detecting elements are n-type MOSFETs. However, the explanation is also established when the leakage detecting elements are p-type MOSFETs.

Figure 43:
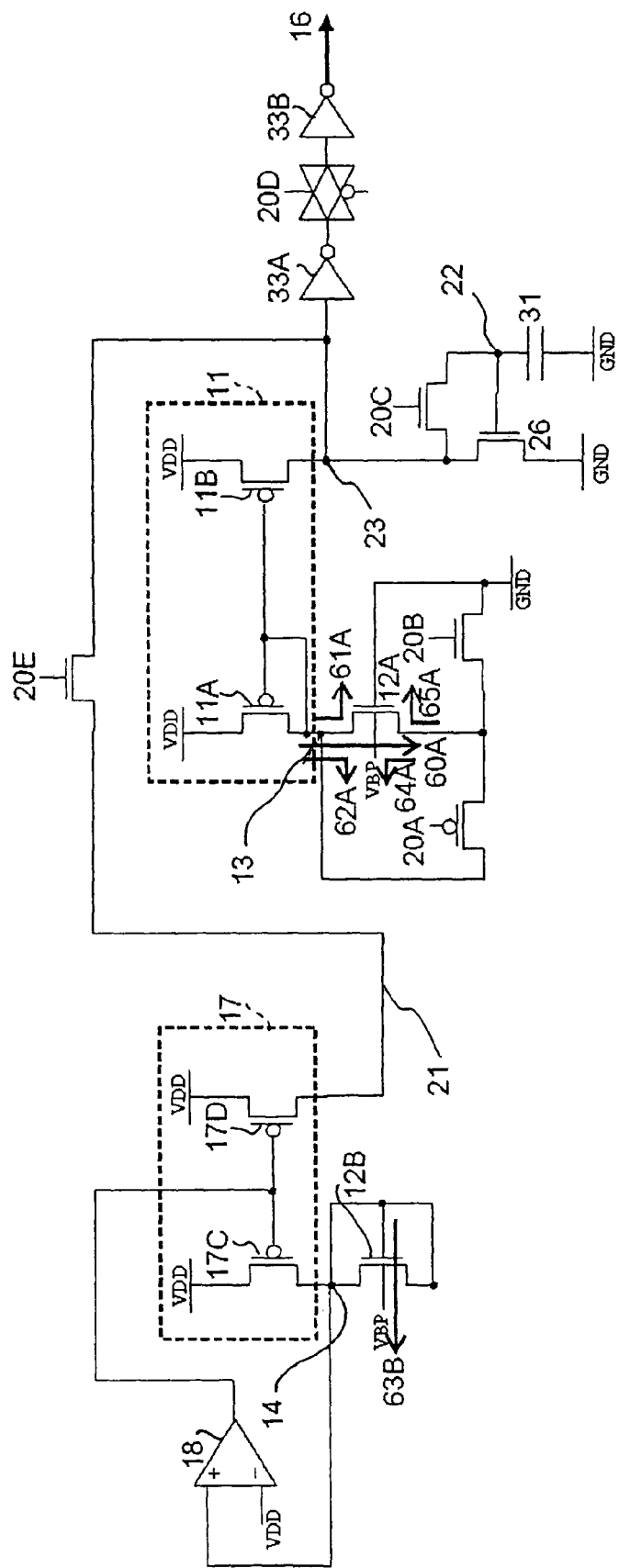
FIG. 43 is a circuit diagram showing a leakage detecting circuit in an eighteenth example of the present invention.

FIG. 43 shows the configuration of a leakage detecting circuit according to the example. The leakage detecting circuit is constituted by MOSFETs 11A and 11B constituting a current mirror circuit 11, MOSFETs 17C and 17D constituting a current mirror circuit 17, an n-type MOSFET 26, an operational amplifier 18, a capacitor 31, a p-type MOSFET 20A, n-type MOSFETs 20B, 20C, and 20E, a transmission gate 20D, inverters 33A and 33B, and a leakage detecting MOSFETs 12A and 12B.

The MOSFETs 11A and 11B constituting the current mirror circuit 11 are p-type MOSFETs having equal element sizes. MOSFETs 17C and 17D constituting the current mirror circuit 17 are p-type MOSFETs having equal element sizes.

As the MOSFETs 12A and 12B for detecting a leakage current, element having the same characteristics as those of an element used in the controlled circuit 5, and the MOSFET 12A and the MOSFET 12B are made equal to each other in size.

The power supply voltage VDD is input to an inverted input terminal of the operational amplifier 18. A potential of a node 14 is kept at a ground potential GND by a feedback loop constituted by the operational amplifier 18 and the MOSFET 17C.

Figure 44:
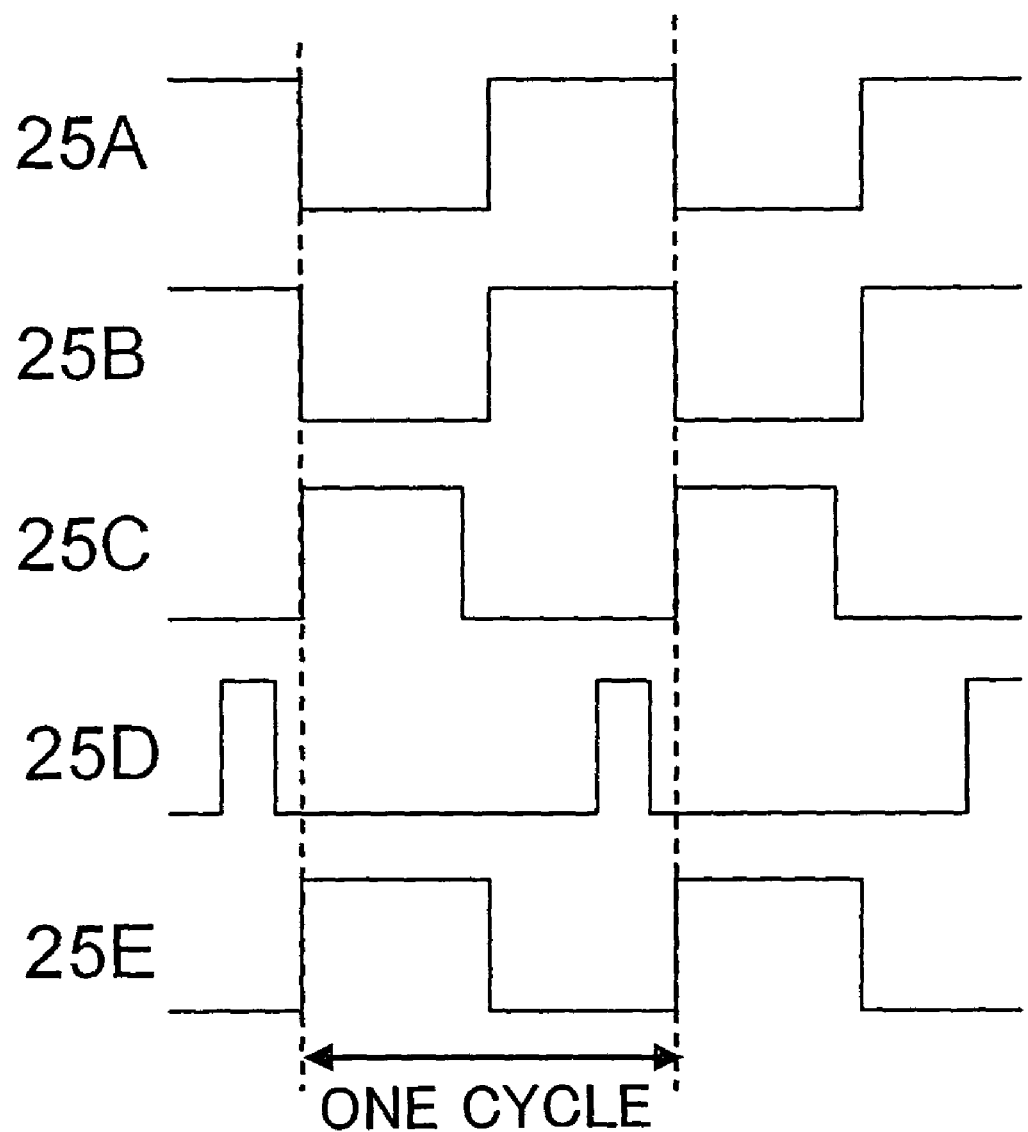
FIG. 44 is a timing chart showing timings of control clocks in the eighteenth example of the present invention.

Different clock signals 25A, 25B, 25C, 25D, and 25E are input to the MOSFETs 20A, 20B, 20C, 20D, and 20E respectively. Timing charts of the clocks are shown in FIG. 44.

An operation of the leakage detecting circuit will be described below with reference to the timing charts in FIG. 44.

The clock signals 25A and 25B go to a low level, and the source and the drain of the MOSFET 12 are connected to each other. The clock signal 25E goes to a high level, nodes 21 and 23 are connected to each other. This state is called a substrate leakage current detection phase. At this time, a drain current of the MOSFET 12A is equal to a sum of an inter-drain-substrate current, and an inter-drain-gate current. However, the inter-drain-substrate current is two times larger than that of when the source is grounded. Further, the drain current of the MOSFET 12B is an inter-gate-substrate current. A drain current of the MOSFET 12 is subjected to mirroring for the MOSFET 11B through the current mirror circuit 11 and a drain current of the MOSFET 12B is subjected to mirroring for the MOSFET 17D. Therefore, a drain current of the MOSFET 26 is a sum of the inter-drain-substrate current, the inter-drain-gate current, and the inter-gate-substrate current of the MOSFET 12B.

Next, the clock signal 25C goes to a low level, and a gate potential of the MOSFET 26 is fixed by disconnecting the drain and gate of the MOSFET 26.

Then, the clock signals 25A and 25B go to high level, the source of the MOSFET 12 is grounded. The clock signal 25E goes to a low level, and nodes 21 and 23 are disconnected to each other. This state is called a subthreshold leakage current detection phase. At this time, a drain current of the MOSFET 12A is equal to a sum of an inter-drain-substrate current, an inter-drain-gate current, and a subthreshold leakage current. The drain current of the MOSFET 12A is subjected to mirroring for the MOSFET 11B through the current mirror circuit 11. Therefore, a drain current of the MOSFET 26 is a sum of the inter-drain-substrate current, the inter-drain-gate current, and the subthreshold leakage current of the MOSFET 12A.

In this case, when the drain current of the MOSFET 26 in the substrate leakage current detection phase is larger than the drain current of the MOSFET 26 in the subthreshold leakage current detection phase, that is, the subthreshold leakage current is larger than the substrate leakage current, the potential of a node 14 approximates to a high level. Further, the substrate leakage current is equal to a sum of the inter-drain-substrate current and the inter-gate-substrate current. In contrast to this, the MOSFET 26 in the substrate leakage current detection phase is smaller than the drain current of the MOSFET 26 in the subthreshold leakage current detection phase, that is, the subthreshold leakage current is smaller than the substrate leakage current, the potential of the node 14 approximates to a low level.

The clock signal 25D goes to a high level, an output 16 is changed into a high level when the node 14 is at a high level, and the output 16 is changed into a low level when the node 14 is at a low level. Thereafter, the clock signal 25D returns to the low level.

The operation performed up to now is defined as one cycle. The same operation will be repeated subsequently.

A control signal is transmitted to the substrate bias generating circuit 4 such that the substrate bias generating circuit 4 operates in a direction to make a substrate bias VBP deep when the output 16 from the detecting circuit is at a high level and the substrate bias generating circuit 4 operates in a direction to make the substrate bias VBP shallow when the output 16 from the detecting circuit is at a low level. In this case, the substrate bias VBP is fixed to a potential at which the subthreshold leakage current and the substrate leakage current are equal to each other. At this time, the leakage current is minimum.

In this manner, by using the semiconductor integrated circuit device according to the example, the substrate bias can be controlled such that the leakage current is minimum.

In the example, since the substrate leakage current including the inter-gate-substrate current is compared with the subthreshold leakage current, even though the inter-gate-substrate current is so large that the inter-gate-substrate current cannot be neglected, a detection error can be considerably reduced.

The capacitor 31 is used to hold the gate potential of the MOSFET 26 in the example. However, the capacitor 31 may not be used when a fluctuation in potential of the node 22 is sufficiently small because the clock cycle is sufficiently short or leakage to another node is sufficiently small.

In the example, the p-type MOSFET is used as the element 20A, the n-type MOSFETs are used as the elements 20B, 20C, and 20E, and the transmission gate is used as the element 20D. However, any elements which can be completely turned on or off depending on clock inputs described in the example may be used in place of the p-type MOSFET, the n-type MOSFET, the transmission gate, and the like. In contrast to this, if switches can be turned on or off at the timing described in the example, the elements and the clock inputs may be changed.

Nineteenth Example

Figure 45:
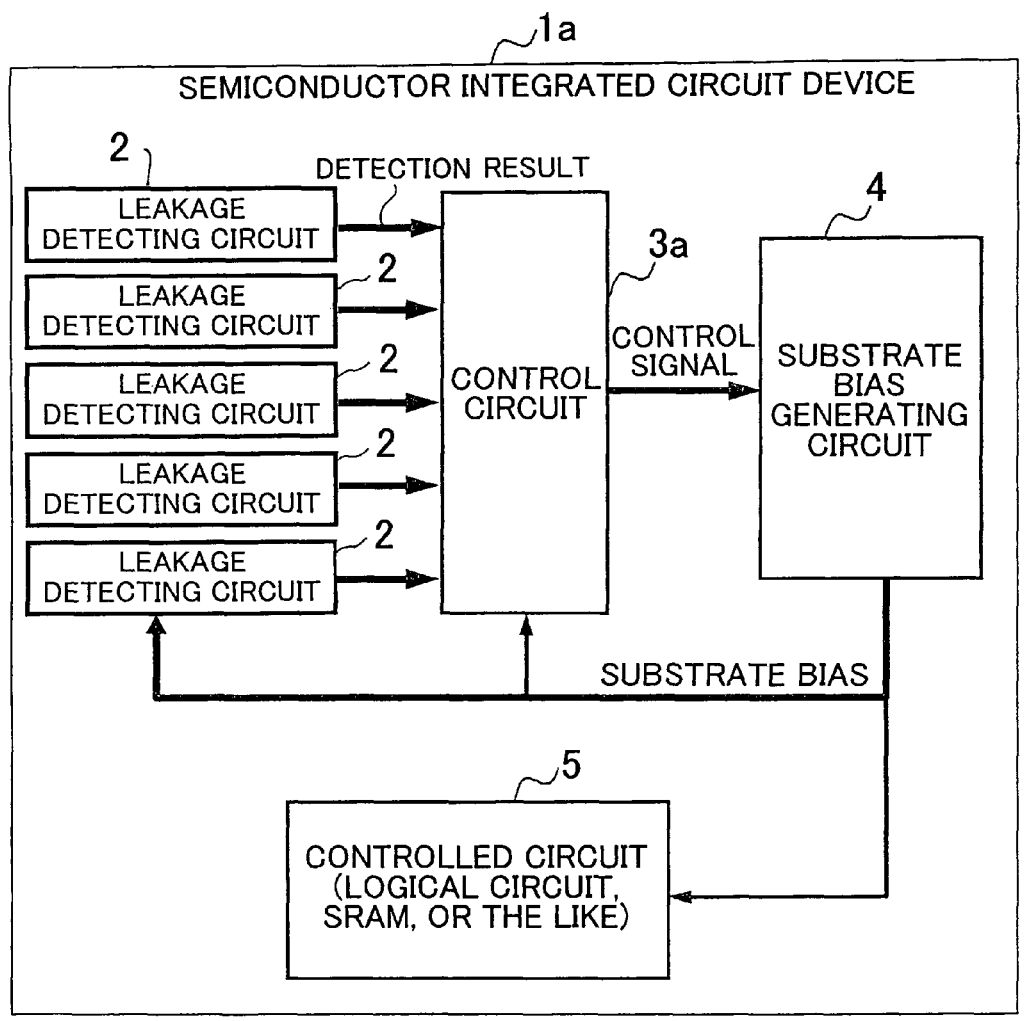
FIG. 45 is a block diagram showing an entire configuration of a semiconductor integrated circuit device according to a nineteenth example of the present invention.

An entire circuit configuration of a nineteenth example of a semiconductor integrated circuit device according to the present invention is shown in FIG. 45. A semiconductor integrated circuit device 1a is constituted by n (n≧2) leakage detecting circuit 2 each having at least one of a leakage detecting n-type MOSFET and a leakage detecting p-type MOSFET, a control circuit 3a for generating a control signal depending on outputs from the leakage detecting circuits 2, and a substrate bias generating circuit 4 for changing a substrate bias of the semiconductor circuit according to the control signal. A controlled circuit 5 is an object the leakage current of which is reduced by an effect of the present invention.

The operation of the entire control circuit in the example is the same as that in the first example except for the configurations of the leakage detecting circuit and the control circuit. Each of the leakage detecting circuits has the same circuit configuration as that of any one of the leakage detecting circuits described in the nineteenth example. The control circuit 3a generates a control signal depending on outputs from the n leakage detecting circuits. For example, a control signal is transmitted to the substrate bias generating circuit such that a substrate bias is made deep when outputs from major part of the n leakage detecting circuits 3 are at a high level and such that the substrate bias is held when the outputs from major part of the n leakage detecting circuits 3 are at a low level.

By using the semiconductor integrated circuit device according to the example, an influence on control of a substrate bias can be suppressed to a very low level even though an abnormal operation is performed in some leakage detecting circuit of the plurality of leakage detecting circuits.

What is claimed is:

1. A semiconductor integrated circuit device comprising:
a leakage detecting circuit which includes a plurality of leakage detecting MOSFETs and which detects components of leakage current of the plurality of MOSFETs;
a control circuit which outputs a control signal depending on a detection result from the leakage detecting circuit; and
a substrate bias generating circuit which changes a substrate bias of a semiconductor substrate depending on the control signal,
wherein the substrate bias is controlled such that a ratio of a subthreshold leakage current component including a subthreshold leakage current of a first one of the plurality of leakage detecting MOSFETs to a substrate leakage current component including a substrate leakage current of a second one of the plurality of the leakage detecting MOSFETs is a predetermined value, and
wherein the first and second ones of the plurality of leakage detecting MOSFETs detect different leakage current components.

2. The semiconductor integrated circuit device according to claim 1, wherein on the semiconductor substrate, there are arranged the leakage detecting circuit and a controlled circuit including a MOSFET having the same characteristics of the plurality of leakage detecting MOSFETs.

3. The semiconductor integrated circuit device according to claim 1, wherein the substrate bias is controlled such that the leakage current decreases as small as possible.

4. The semiconductor integrated circuit device according to claim 1, wherein the substrate bias is controlled to a value which is made deep as much as possible within a range in which a GIDL (Gate Induced Drain Leakage) effect does not conspicuously appear.

5. The semiconductor integrated circuit device according to claim 1, wherein the substrate leakage current component is any one of an inter-drain-substrate current or a sum of an inter-drain-substrate current and an inter-gate substrate current or a sum of the inter-drain-substrate current, the inter-source-substrate current, and the inter-gate-substrate current when the gate potential of one of the plurality of leakage detecting MOSFETs is an arbitrary gate potential in a subthreshold region.

6. The semiconductor integrated circuit device according to claim 1, wherein the subthreshold leakage current component is an inter-source-drain current when the gate potential of one of the plurality of leakage detecting MOSFETs is an arbitrary gate voltage value in a subthreshold region.

7. The semiconductor integrated circuit device according to claim 1, wherein a plurality of different leakage current components are detected from a same MOSFET of the plurality of leakage detecting MOSFETs.

8. The semiconductor integrated circuit device according to claim 1, wherein the leakage detecting circuit is designed such that connections in the leakage detecting circuit are dynamically changed to switch a plurality of detection modes, and different leakage current components are detected in the respective detection modes.

9. The semiconductor integrated circuit device according to claim 1, wherein at least one of the plurality of leakage detecting MOSFETs is an n-type MOSFET having a source fixed to a ground potential.

10. The semiconductor integrated circuit device according to claim 1, wherein at least one of the plurality of leakage detecting MOSFETs is a p-type MOSFET having a source fixed to a power supply voltage.

11. The semiconductor integrated circuit device according to claim 1, wherein at least one of the plurality of leakage detecting MOSFETs is an n-type MOSFET having a drain fixed to a power supply voltage.

12. The semiconductor integrated circuit device according to claim 1, wherein at least one of the plurality of leakage detecting MOSFETs is a p-type MOSFET having a drain fixed to a ground potential.

13. The semiconductor integrated circuit device according to claim 1, wherein at least one inter-source-drain voltage of the plurality of leakage detecting MOSFETs is equal to the power supply voltage.

14. The semiconductor integrated circuit device according to claim 1, wherein the leakage detecting circuit has a plurality of switches to switch connections of elements constituting the circuit, the leakage detecting circuit is connected such that at least one of the plurality of leakage detecting MOSFETs functions as a part of the leakage detecting circuit when the substrate bias generating circuit controls a substrate bias, and the leakage detecting circuit is connected such that an ON current is caused to flow in the at least one of the plurality of leakage detecting MOSFETs when the substrate bias generating circuit does not control the substrate bias.

15. The semiconductor integrated circuit device according to claim 1, comprising
the plurality of leakage detecting circuits, and wherein
a bias of the semiconductor substrate is changed on the basis of detection results of a plurality of leakage currents.

16. A semiconductor integrated circuit device comprising:
a leakage detecting circuit which detects a leakage current of a semiconductor substrate;
a control circuit which outputs a control signal; and
a substrate bias generating circuit which changes a substrate bias,
wherein the leakage detecting circuit detects a substrate leakage current and a subthreshold leakage current,
wherein the substrate leakage current exceeds n times the subthreshold leakage current as a magnitude of the substrate bias increases past a point where the substrate leakage current and n times the subthreshold leakage current are equal, and n times the subthreshold leakage current exceeds the substrate leakage current as the magnitude of the substrate bias decreases past a point where the substrate leakage current and n times the subthreshold leakage current are equal,
wherein the control circuit transmits a control signal to the substrate bias generating circuit such that the magnitude of the substrate bias increases when the substrate leakage current is smaller than a current which is n times the subthreshold leakage current and such that the magnitude of the substrate bias decreases when the substrate leakage current is larger than the current, and
wherein n is a predetermined number.

17. The semiconductor integrated circuit device according to claim 16, wherein the leakage detecting circuit detects both an inter-drain-substrate current and an inter-gate-substrate current.

18. The semiconductor integrated circuit device according to claim 16, wherein the leakage detecting circuit has a plurality of leakage detecting elements, the respective leakage detecting elements detect different components of leakage currents, and the substrate leakage current is compared with the subthreshold leakage current on the basis of detection results.

19. The semiconductor integrated circuit device according to claim 16, wherein the leakage detecting circuit including one leakage detecting element detects a plurality of different leakage current components from the leakage detecting element, and compares the substrate leakage current with the subthreshold leakage current on the basis of detection results.

20. The semiconductor integrated circuit device according to claim 16, wherein the leakage detecting circuit includes a leakage detecting element, and when the leakage detecting element is an n-type MOSFET, a source of the n-type MOSFET is fixed to a ground potential, and, when the leakage detecting element is a p-type MOSFET, a source of the p-type MOSFET is fixed to a power supply voltage.

21. The semiconductor integrated circuit device according to claim 16, wherein the leakage detecting circuit includes a leakage detecting element, and when the leakage detecting element is an n-type MOSFET, a drain of the n-type MOSFET is fixed to a power supply voltage, and, when the leakage detecting element is a p-type MOSFET, a drain of the p-type MOSFET is fixed to a ground potential.

22. The semiconductor integrated circuit device according to claim 16, wherein the leakage detecting circuit includes a leakage detecting element, and an inter-source-drain voltage of the leakage detecting element is fixed to a power supply voltage.

23. The semiconductor integrated circuit device according to claim 16, wherein the leakage detecting circuit includes a leakage detecting element, and connections in the circuit are dynamically switched to detect a plurality of current components from the leakage detecting element.

24. The semiconductor integrated circuit device according to claim 16, wherein the leakage detecting circuit has a detection mode and an energization mode and dynamically changes connections in the circuit, a configuration having the same function as that of the semiconductor integrated circuit device according to claim 19 is used in the detection mode, and a configuration which causes an ON current to flow in the leakage detecting element is used in the energization mode.

25. The semiconductor integrated circuit device according to claim 16, comprising
a plurality of leakage detecting circuits, and wherein
the substrate bias is changed on the basis of output results from major part of the leakage detecting circuits.

26. The semiconductor integrated circuit device according to claim 18, wherein a source of a leakage detecting element which does not detect the subthreshold leakage current is connected to a drain of the leakage detecting element, or the source of the leakage detecting element is disconnected from another node.

* * * * *